United States Patent
Lee et al.

(10) Patent No.: US 7,407,845 B2
(45) Date of Patent: Aug. 5, 2008

(54) FIELD EFFECT TRANSISTOR AND METHOD FOR MANUFACTURING THE SAME

(75) Inventors: Choong-Ho Lee, Gyeonggi-do (KR); Jae-Man Yoon, Seoul (KR); Dong-Gun Park, Gyeonggi-do (KR); Chul Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 358 days.

(21) Appl. No.: 11/048,369

(22) Filed: Jan. 31, 2005

(65) Prior Publication Data

US 2005/0176186 A1    Aug. 11, 2005

(30) Foreign Application Priority Data

Feb. 10, 2004    (KR) .............. 10-2004-0008590

(51) Int. Cl.
*H01L 21/84* (2006.01)
(52) U.S. Cl. ............... 438/157; 438/284; 257/E21.442
(58) Field of Classification Search ............... 438/157, 438/283, 284, 596; 257/E21.442
See application file for complete search history.

(56) References Cited

U.S. PATENT DOCUMENTS

| | | | |
|---|---|---|---|
| 4,996,574 A | 2/1991 | Shirasaki | |
| 5,120,666 A | 6/1992 | Gotou | |
| 5,578,513 A | 11/1996 | Maegawa | |
| 5,583,362 A | 12/1996 | Maegawa | |
| 5,926,699 A * | 7/1999 | Hayashi et al. | 438/157 |
| 6,495,403 B1 | 12/2002 | Skotnicki et al. | |
| 6,657,252 B2 * | 12/2003 | Fried et al. | 257/316 |

* cited by examiner

*Primary Examiner*—Chandra Chaudhari
(74) *Attorney, Agent, or Firm*—Marger Johnson & McCollom, P.C.

(57) ABSTRACT

In one embodiment, a semiconductor device includes a semiconductor substrate having a lower layer and an upper layer overlying the lower layer. The upper layer is arranged and structured to form first and second active regions that are spaced apart from each other and protrude from an upper surface of the lower layer. A third active region of a bridge shape is distanced vertically from the upper surface of the lower layer and connects the first and second active regions. The device further includes a gate electrode, which is formed with a gate insulation layer surrounding the third active region, so that the third active region functions as a channel.

29 Claims, 28 Drawing Sheets

FIELD EFFECT TRANSISTOR AND METHOD FOR MANUFACTURING THE SAME

CROSS REFERENCE TO RELATED APPLICATIONS

This application claims priority from Korean Patent Application No. 2004-8590, filed on Feb. 10, 2004, the contents of which are hereby incorporated by reference for all purposes.

BACKGROUND OF THE INVENTION

1. Field of the Invention

This disclosure relates to a semiconductor device, and more particularly, to a field effect transistor having a gate all around (GAA) structure and a method of manufacturing the same.

2. Description of the Related Art

A recent rapid development in the information and communication fields, and a popularization of information media, such as computers, have brought rapid progress of semiconductor devices. A high-integration of semiconductor devices has brought about research for several kinds of methods to reduce a feature size of individual devices formed on a substrate from a functional viewpoint, and to increase performance of the devices. In such methods a field effect transistor (FET) is utilized to improve an integration of the device on the basis of a silicon semiconductor technique and a CMOS (Complementary Metal Oxide Semiconductor) technique. A scaling-down of a general planar field effect transistor in conformity with the high-integration of the devices lowers performance or reliability of the devices, thus three-dimensional structures such as a vertical transistor have been proposed instead of a planar type structure. As an example, a fin field effect transistor (FET) has been proposed in the field. The fin shape generally is like a dorsal of a fish, which is a vertical structure of a body of the transistor.

In detail, in an FET of a planar structure that employs the existing single-crystal silicon substrate as a channel, a length of a gate electrode is scaled down under 500 Å, thus being very sensitive to a process condition and difficult to control characteristics of devices in a manufacturing process. Moreover, when a length of channel is about 300 Å, the performance of the devices may suffer. For example, in a field effect transistor (FET) developed by Intel Corp., a length of gate electrode is about 300 Å, and, a current-to-voltage (I-V) characteristic is not prominent as compared with a conventional FET having a channel of over about 500 Å. An area occupied by one FET is not reduced as compared with a conventional case because of a spacer region formed on sidewalls of a non-scaled down gate electrode. Thus integration is not improved. Therefore, methods of forming the three-dimensional FET device are, for example, DELTA (fully Depleted Lean-channel Transistor) and a GAA (Gate All Around) structure. An example of MOSFET (Metal Oxide Semiconductor Field Effect Transistor) having the DELTA structure is disclosed in U.S. Pat. No. 4,996,574. The DELTA structure has an active layer where a channel will be formed. The active layer has a predetermined width and protrude vertically. In this structure, also a gate electrode is formed to surround the vertically protruded channel portion. Thus, a height of the protruded portion becomes a width of the channel and a width of the protruded portion becomes a length of a gate region where the channel is formed. In such an FET having the DELTA structure, an entire face of the protruded portion can be all used as the channel, thus the width of the channel has a remarkably increased effect as compared with an FET of the planar structure. That is, the FET of the DELTA structure can prevent a narrow channel effect based on a reduction of channel width because a length of the channel is not reduced by a reduction of the device formation region as compared with a general transistor. If a width of the protruded portion is reduced, a depletion layer of the channel formed in the gate region may be depleted fully or partially, thus increasing a conduction of the channel. In the meantime, if a semiconductor device of the DELTA structure is applied to a general silicon substrate, the silicon substrate is processed in such a way that a portion where a channel is formed on the silicon substrate, is protruded. Then, the protruded portion is covered with an oxide prevention layer and the resulting structure is oxidized. If the oxidization is performed excessively, the protruded portion having a channel formation and a portion connected to a substrate body are oxidized by oxygen atoms diffused to a side direction from a portion not protected by the oxide prevention layer. Thus, the channel is separated from a main body portion of the silicon substrate. In these procedures a thickness of the channel of the connection part becomes small while the channel separation is performed by the excessive oxidization, and a single-crystal layer is pressurized and damaged under the oxidation procedure. Furthermore, if an SOI (Silicon On Insulator) type silicon substrate, in which an interlayer dielectric layer is formed in a lower part of semiconductor substrate, is applied to the formation of the DELTA structure, an SOI layer is etched to become a smaller width and to form a channel portion. Thus a problem caused by the excessive oxidation in using the single-crystal silicon substrate is prevented. However, if an FET of a double-gate or tri-gate structure, similar to the DELTA structure manufactured on the single-crystal silicon substrate, is manufactured intact on the SOI type silicon substrate, and that its characteristic is analyzed, then a body of the transistor is not coupled with the substrate by a device characteristic of the SOI type silicon substrate. Thus a floating body effect can be caused, lowering the performance of the devices.

Meanwhile, in an FET of the GAA structure a gate electrode is formed, surrounding an entire face of active region of a bridge structure, thus in comparison with the FET of the DELTA structure, the FET of the GAA structure has more prominent electrical characteristics. An example of an FET having the GAA structure is disclosed in U.S. Pat. No. 6,495,403.

FIG. 1 is a perspective view illustrating a conventional structure of an FET.

A method of manufacturing the FET having the structure of FIG. 1 will be described as follows.

Referring to FIG. 1, on an active region 2 of a silicon substrate 1 selectively exposed by a dielectric layer 3 or an insulation layer, a single-crystal silicon germanium SiGe layer (not shown) or a Ge layer having a predetermined thickness is formed through a selective epitaxial growth method. Then, on the single-crystal silicon germanium layer or germanium layer, and the dielectric layer 3 or the insulation layer, a silicon layer is formed through a non-selective epitaxial growth method. Herewith, the silicon layer formed on the active region 2 where the SiGe or Ge was formed, is grown as a single-crystal silicon layer 5a, and the silicon layer formed on the dielectric layer 3 or the insulation layer is formed of a polysilicon layer 5b. On the single-crystal silicon layer 5a a channel impurity region may be formed by ion implanting a first conductive impurity in the single-crystal silicon layer 5a and the polysilicon layer 5b.

The single-crystal silicon layer 5a and the polysilicon layer 5b are patterned through a general photolithography and etching method, to form a fin active region 5 of one direction. To form the fin active region 5 of a bridge shape, a silicon germanium layer or germanium layer is removed to form a tunnel 7. On the polysilicon layer 5b and the single-crystal silicon layer 5a of the bridge shape, a gate insulation layer 8 and 9 is formed, and then conductive material is formed, surrounding an overall face of the single-crystal silicon layer 5a on which the gate insulation layer 8 and 9 is formed. The conductive material is patterned through a general photolithography and etching method, to form a gate electrode 10. The gate electrode 10 is formed to have a distance smaller than or equal to the single-crystal silicon layer 5a.

Last, a second impurity of a low density is ion implanted in the single-crystal silicon layer 5a and the polysilicon layer 5b exposed by the gate electrode 10, to form a first impurity region (not shown), and respective contacts 11, 12 and 13 are formed on the gate electrode 10 and source/drain regions.

In the method of manufacturing the FET according to the prior art, the selective epitaxial growth is used to form the single-crystal silicon layer 5a on the silicon germanium layer or germanium layer and to form the gate electrode 10 surrounding an entire face of the single-crystal silicon layer 5a. Accordingly, a single-crystal silicon layer having an electrical characteristic more prominent than the polysilicon layer 5b grown through the existing epitaxial growth method can be used as a channel formation region.

However, a method of manufacturing an FET according to the prior art has the following problems.

First, the single-crystal silicon layer 5a used as a channel formation region is grown by an epitaxial growth method that may have a crystalline defect because of a generation rate that is higher than a bulk silicon substrate. Thus a reliability of these devices may be lowered.

Second, conductive material formed in a lower part of the tunnel 7 having a bridge structure is not reproducibly removed when the conductive material is removed by a photolithography and etching method using a general dry or wet etching (in forming the gate electrode 10 surrounding the single-crystal silicon layer 5a of the bridge structure). Thus, a length of channel cannot be controlled precisely.

Third, an active region of the source/drain region is formed of polysilicon having a low electrical conductivity as compared with the single-crystal silicon.

SUMMARY OF THE INVENTION

In one embodiment, a semiconductor device includes a semiconductor substrate having a lower layer and an upper layer overlying the lower layer. The upper layer is arranged and structured to form first and second active regions that are spaced apart from each other and protrude from an upper surface of the lower layer. A third active region of a bridge shape is distanced vertically from the upper surface of the lower layer and connects the first and second active regions. The device further includes a gate electrode, which is formed with a gate insulation layer surrounding the third active region, so that the third active region functions as a channel.

Consequently, a gate electrode having high reproducibility can be formed without a photolithography and etching method, thereby precisely controlling a length of channel. Furthermore, an electrical conductivity of source and drain regions increases, improving an electrical characteristic of the device.

BRIEF DESCRIPTION OF THE DRAWINGS

The above and other features of exemplary embodiments of the invention will become readily apparent from the description that follows, with reference to the attached drawings.

DETAILED DESCRIPTION OF THE PREFERRED EMBODIMENTS

Exemplary embodiments of the invention are more fully described in detail with reference to the accompanied drawings. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art. For example, some layer may contact directly with a semiconductor substrate or a third layer may be interposed. Further, a semiconductor substrate and a silicon substrate may be used together.

Figure 1:
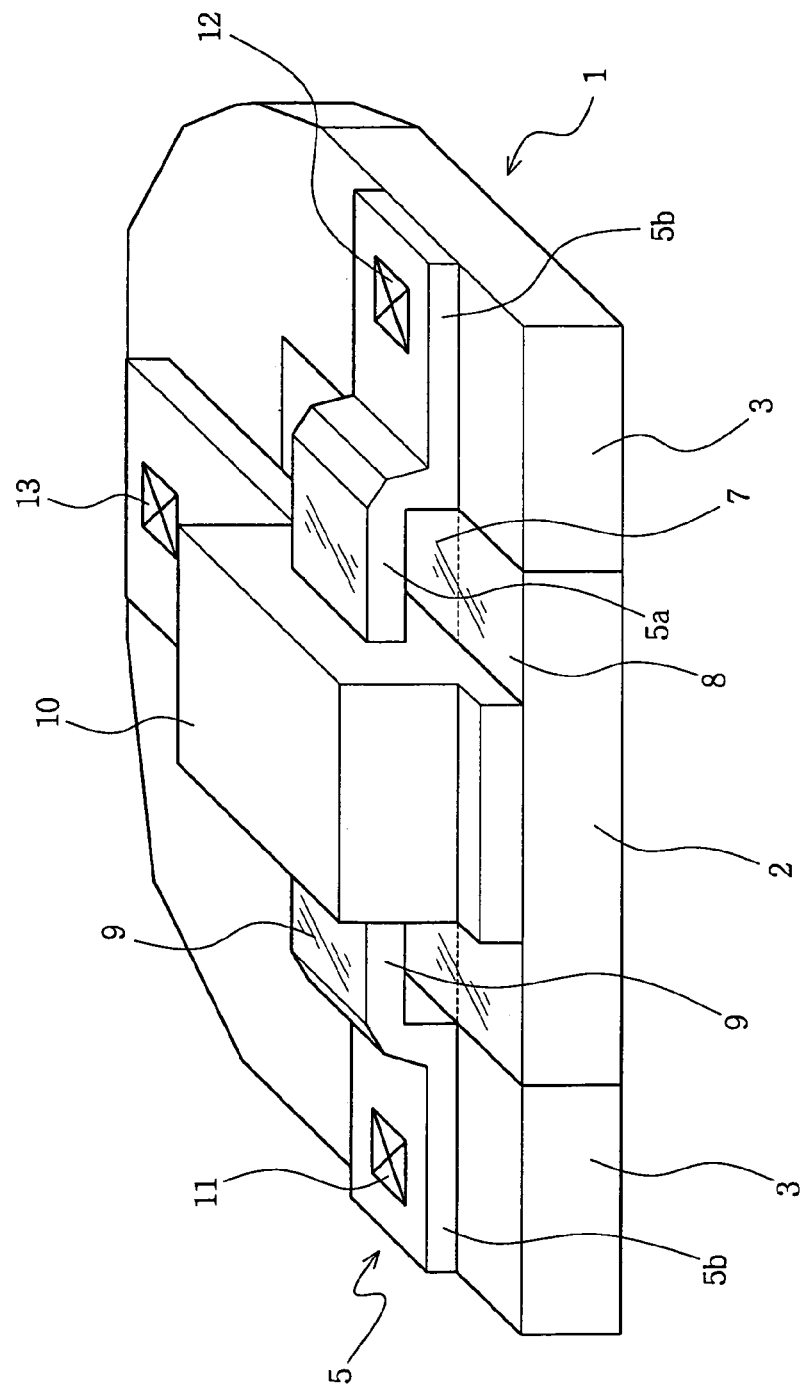
FIG. 1 is a perspective view illustrating a structure of FET according to a prior art.
Figure 2:
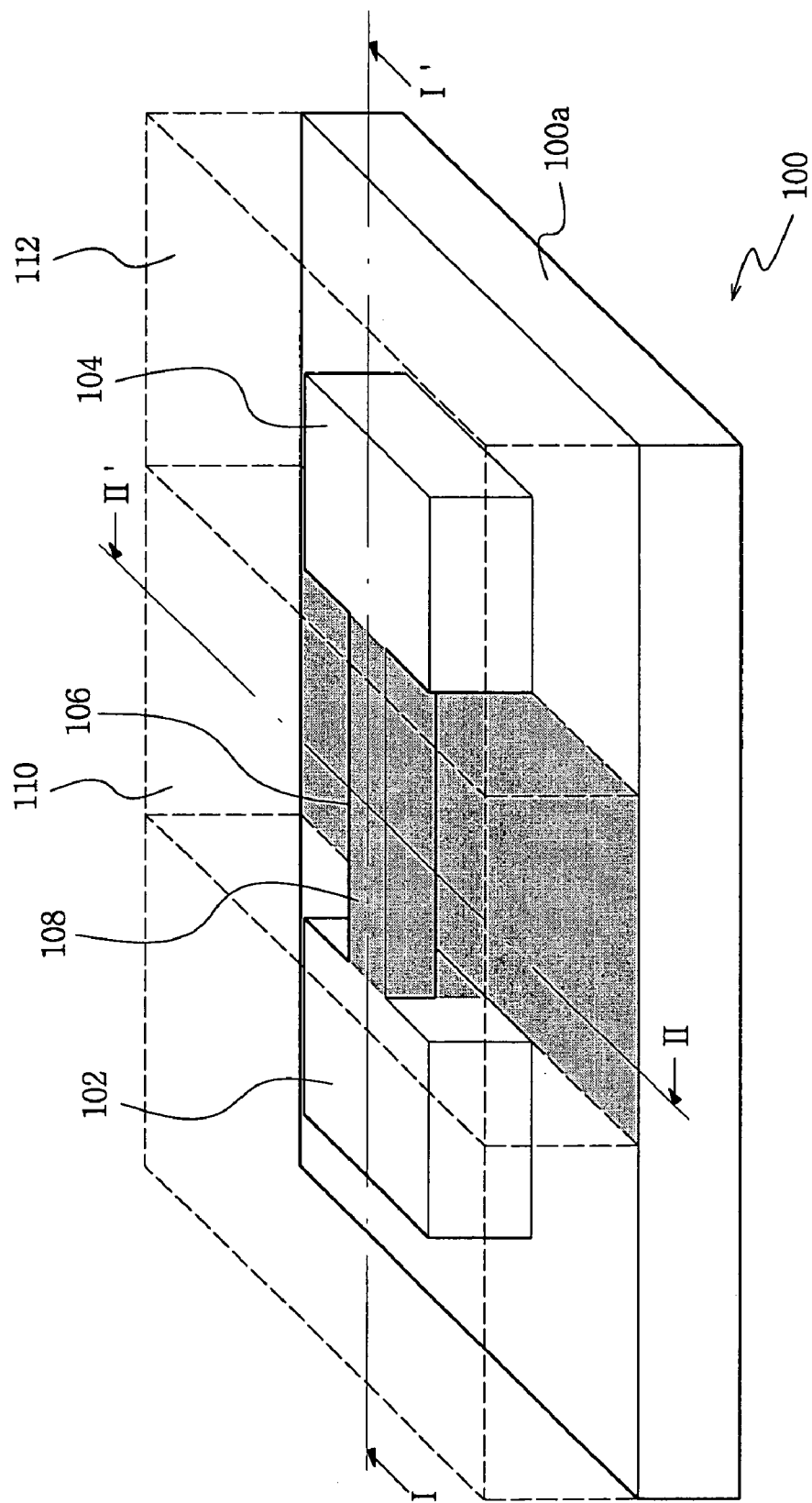
FIG. 2 is a perspective view schematically illustrating an FET according to an exemplary embodiment of the invention.

FIG. 2 is a perspective view illustrating a field effect transistor according to an exemplary embodiment of the invention.

Referring to FIG. 2, according to the exemplary embodiment, first and second active regions 102 and 104 are distanced from each other and protrude from an upper surface of a lower layer of a semiconductor substrate 100. The semiconductor substrate 100 is divided into the lower layer and an upper layer overlying the lower layer. The first and second active regions 102 and 104 are adapted to function as a source region and a drain region. Further, a third active region 106 is formed having a bridge shape structure being distanced vertically from an upper surface of the lower layer of the semiconductor substrate 100, and also being connected with the first and second active regions 102 and 104. The third active region 106 forms a gate region or a channel region. The semiconductor substrate 100 is divided into an upper layer and a lower layer. The upper layer of the semiconductor substrate 100 becomes the first and second active regions 102 and 104 that are obtained by etching the semiconductor substrate by a predetermined depth, and the third active region 106 formed with a height the same as or similar to the first and second active regions 102 and 104. The lower layer of the semiconductor substrate 100 becomes a surface of the semiconductor substrate or a bulk surface of the semiconductor substrate that supports the first and second active regions 102 and 104. Thus, the lower layer of the semiconductor substrate 100 is defined as a bulk 100a of the semiconductor substrate. The third active region 106 may be formed in a bridge shape in which the upper layer of the semiconductor substrate 100 is selectively removed by undercutting in a piercing shape by a predetermined height from the bulk 100a of the semiconductor substrate, and which is supported by the first and second active regions 102 and 104. Thus, the first and second active regions 102 and 104 protruded from the bulk 100a of the semiconductor substrate, and the third active region 106 connected with the first and second active regions 102 and 104, are all formed of a single-crystal silicon layer of the same material as the semiconductor substrate. Also, if a second conductive impurity of non-metallic material is doped in a first impurity region (120 of FIG. 3h) of the first and second active regions 102 and 104, the third active region 106 may be doped with a first conductive impurity different than the second conductive impurity, the first impurity region being provided as a source/drain impurity region. With a width or thickness of the third active region 106 of over 500 Å, a threshold voltage value can be controlled by ion implanting the first conductive impurity as a channel impurity in the third active region 106. But at a width or thickness of the third active region 106 of under 500 Å, there is an effect that a uniform threshold voltage is pinned almost without an ion implantation efficiency of the second impurity for a control of the threshold voltage value. Thus, the threshold voltage value can be decided by a work function of the single-crystal silicon layer.

A gate insulation layer 108 having a predetermined thickness is entirely formed on the third active region 106 connected with the first and second active regions 102 and 104. A gate electrode 110 is formed surrounding the third active region 106 on which the gate insulation layer 108 was formed so that the third active region 106 can function as a channel. The gate insulation layer 108 is constructed of a silicon oxide layer, and the gate electrode 110 is constructed of a metal layer or a polysilicon layer doped with the non-metal first or second conductive impurity. The gate insulation layer 108 isolates the gate electrode 110, not only from the third active region 106 selectively exposed by the interlayer dielectric layer 112, but also from a sidewall of the first and second active regions 102 and 104 of a lower part of the third active region 106, and from a surface of the semiconductor substrate bulk 100a exposed by the interlayer dielectric layer 112 in a lower part of the third active region 106.

Instead of a general photolithography process the gate electrode 110 is formed surrounding the third active region 106 by a damascene method, as follows: The interlayer dielectric layer 112 surrounding upper parts and side face of the first and second active regions 102 and 104, and patterned in a predetermined shape, and the semiconductor substrate bulk 100a exposed by the interlayer dielectric layer 112, are used as a mold having a predetermined shape.

When a voltage is applied to the source region of the first active region 102 or the second active region 104, and a gate voltage is applied to the gate electrode 110; a channel is formed in the third active region 106 surrounded by the gate electrode.

Therefore, in the FET according to one embodiment of the invention, the first and second active regions 102 and 104 protruded from the semiconductor substrate bulk 100a, and the third active region 106 of a bridge shape connected with the first and second active regions 102 and 104, are formed of a single-crystal silicon layer of the semiconductor substrate 100. This substantially reduces a possibility of a crystalline defect as compared with a single-crystal silicon layer grown by a conventional epitaxial growth method, and improves an electrical characteristic and increases reliability of the device.

A method of manufacturing the FET according to an exemplary embodiment will be described as follows.

FIGS. 3a to 3h are cross-sectional views illustrating processing steps taken along I~I' and II~II' in manufacturing the transistor of FIG. 2.

Figure 3A:
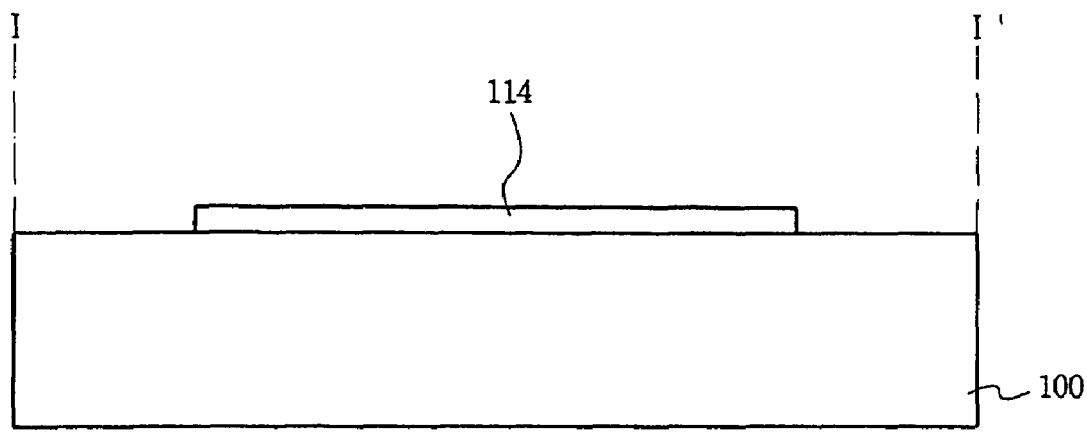
FIGS. 3a to 3h are sectional views sequentially illustrating processes taken along I~I' and II~II' in manufacturing the transistor in FIG. 2.
Figure 3A:
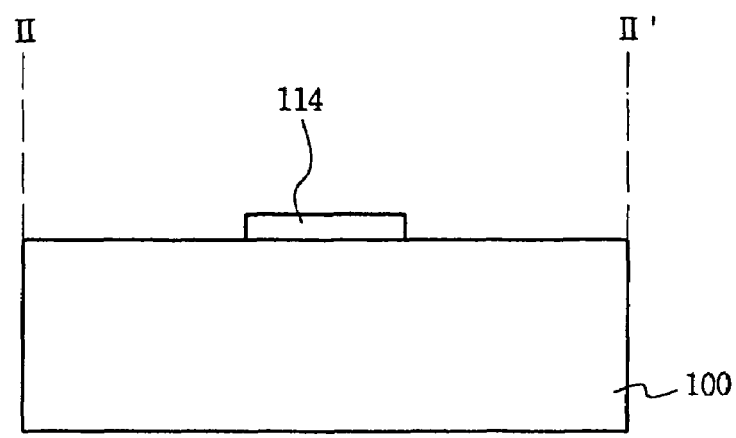

As shown in FIG. 3a, a hard mask layer 114 having a predetermined thickness is formed on the semiconductor substrate 100 of the single-crystal silicon material by chemical vapor deposition, and is then patterned by a general photolithography and etching process. The hard mask layer 114 is formed of silicon nitride or silicon oxynitride. If the hard mask layer 114 is formed of silicon oxynitride, then an anti-reflective layer may be formed on the silicon oxynitride layer, and then the resulting structure is patterned by the photolithography and etching process. Although not shown in the drawing, an etch stop layer having a predetermined thickness formed of silicon oxide is additionally formed between the semiconductor substrate and the hard mask layer 114. Thus, when the hard mask layer 114 is removed, an etch profile can be improved. For example, the hard mask layer 114 is formed to have a thickness under about 1000 Å, and the silicon oxide layer has a thickness under about 500 Å. At this time, an anti-reflective layer having a predetermined thickness may be additionally formed on the hard mask layer 114, to prevent diffused reflection in an exposure procedure of photoresist formed on the hard mask layer 114 in the photolithography and etching procedure. The photolithography and etching process may employ a dry etching method to pattern the hard mask layer 114, and a reactive gas used in the dry etching method is used as a gas having a sufficient selection etching rate for the hard mask layer 114 as compared with the etch stop layer or the single-crystal silicon of the semiconductor substrate.

Figure 3B:
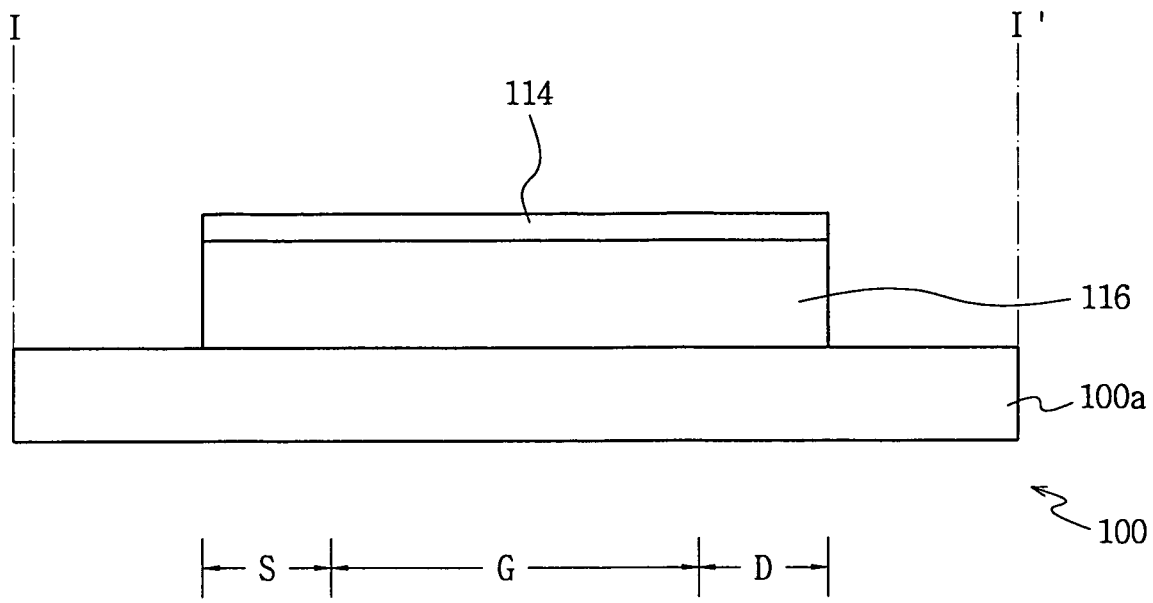
Figure 3B:
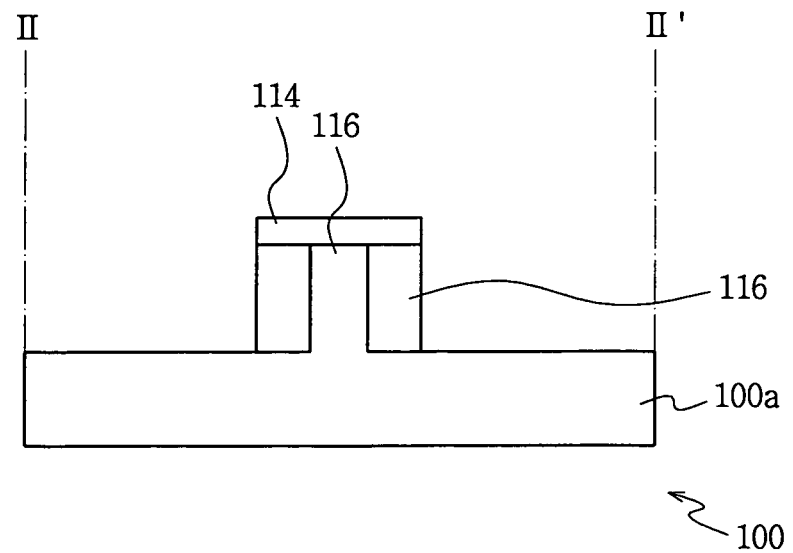

As shown in FIG. 3b, the semiconductor substrate 100 is etched to a predetermined depth by using the hard mask layer 114 as an etch mask, thereby forming, under the hard mask layer 114, a fin active region 116 having a predetermined height from a surface of the semiconductor substrate bulk 100a corresponding to a lower layer of the semiconductor substrate. This etching of the semiconductor substrate 100 employs a dry etching method having a prominent vertical etching characteristic. That is, an upper portion of the semiconductor substrate 100 is etched to a predetermined depth for a predetermined time by a time etch method, such that the fin active region 116 is protruded with a predetermined height. For example, the fin active region 116 is formed to have a height of about 1200 Å to about 1500 Å from a surface of the bulk 100a of the semiconductor substrate.

A line width of the hard mask layer 114 formed on the fin active region 116 is reduced, by a general photolithography and etching method, and the fin active region 116 is trimmed by using the hard mask layer 114 as an etch mask, to reduce a line width, and the hard mask layer 114 is removed.

Figure 3C:
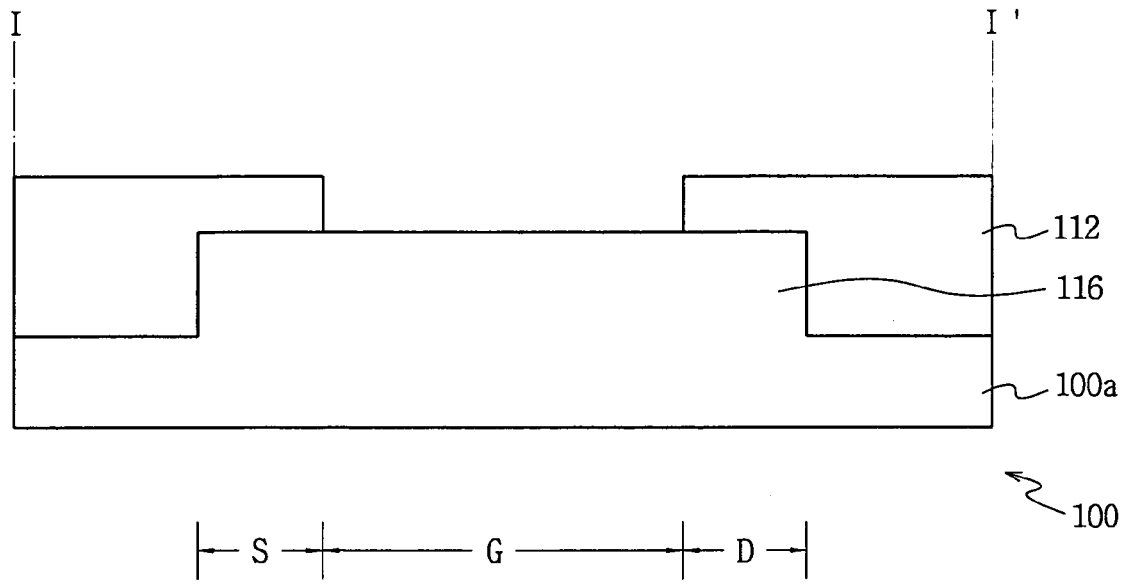
Figure 3C:
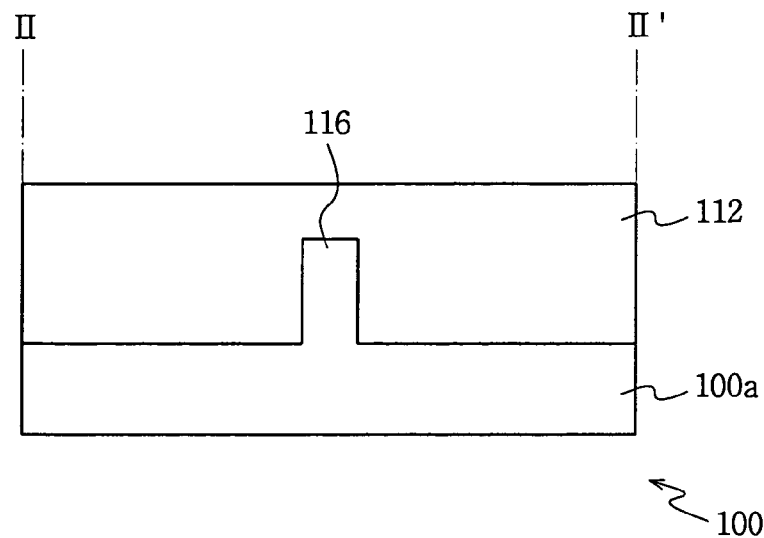

In FIG. 3c, an interlayer dielectric layer (ILD) 112 of silicon oxide layer through CVD is formed overlying the fin active region 116. The interlayer dielectric layer 112 is planarized by a chemical mechanical polishing (CMP), and is removed by a dry etching method to expose the fin active region 116 of a gate region G and a portion of the semiconductor substrate bulk 100a using a conventional photolithography and etching method. For instance, the interlayer dielectric layer 112 is formed to have a thickness of about 3000 Å to about 5000 Å. The photolithography and etching method for exposing the gate region G includes depositing a photoresist on the interlayer dielectric layer 112; patterning the photoresist so that the photoresist is selectively left on both ends of the fin active region 116 corresponding to a source region S and a drain region D; and removing the interlayer dielectric layer 112 to expose the fin active region 116 of the gate region G and a portion of the semiconductor substrate bulk 100a, by a dry etching method, by using the photoresist as an etch mask or screen. The interlayer dielectric layer 112 left on the fin active region 116 corresponding to the source region S and the drain region D is later used to form the gate electrode 110 (of FIG. 2) through a damascene method. Although not shown in the drawing, if the fin active region 116 is not trimmed and the hard mask layer (114 of FIG. 3b) is not removed, the fin active region 116 exposed by the interlayer dielectric layer 112 may be trimmed, thus further reducing a line width of the fin active region 116 than a line width of both ends of the fin active region. Then, the hard mask layer 114 exposed by the interlayer dielectric layer 112 may be removed.

Figure 3D:
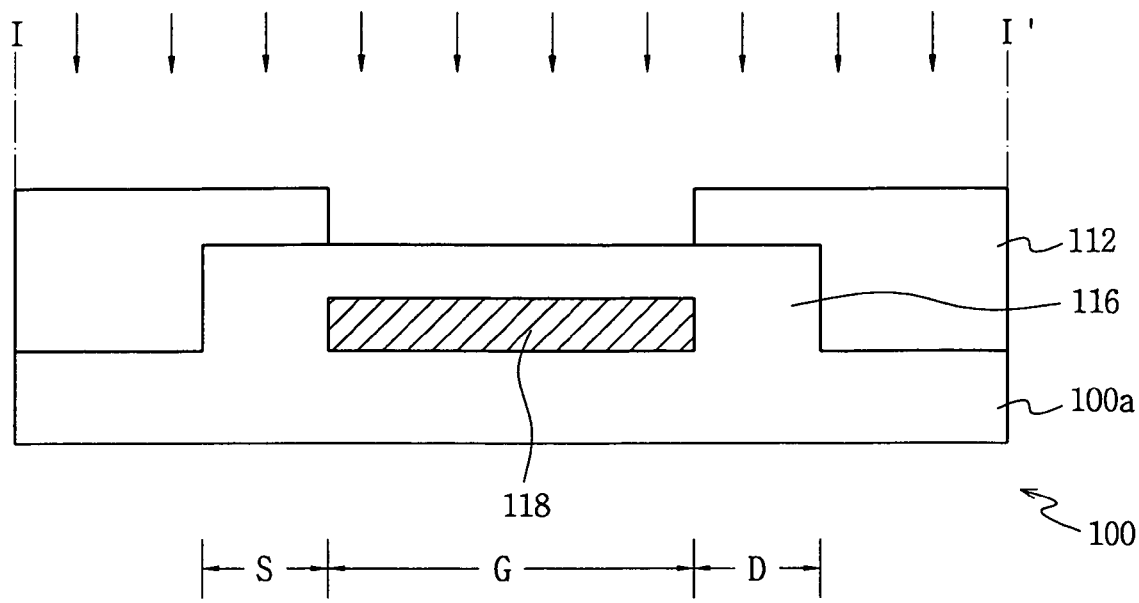
Figure 3D:
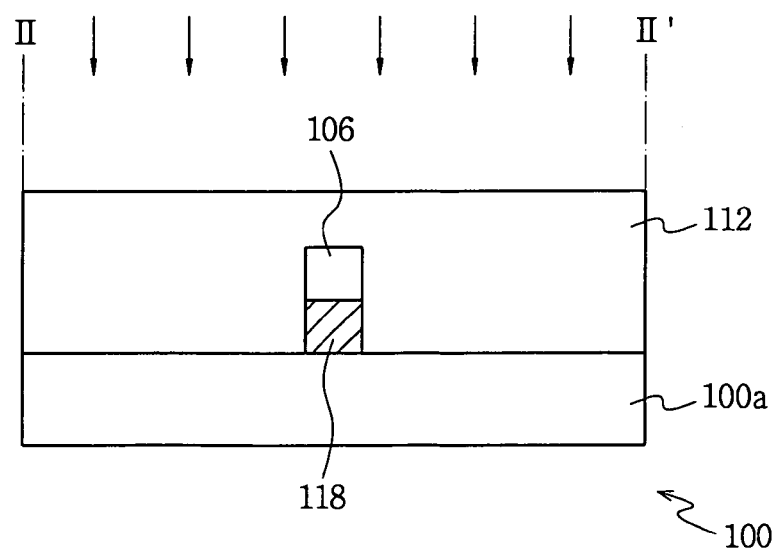

In FIG. 3d, an impurity is selectively ion-implanted in the fin active region 116 of the gate region G by using the interlayer dielectric layer 112 as an ion implantation mask or screen, to thus form a buried impurity region 118. The interlayer dielectric layer 112 is formed on an upper portion and on side walls of the fin active region 116 corresponding to the source region S and the drain region D. This buried impurity may be any one of non-metallic conductive impurities such as boron, $BF_2$, or phosphorous, and of low atomic mass elements such as H and He. The impurity is ion-implanted with a predetermined projection range into the fin active region 116 formed of single-crystal silicon, and penetrates the silicon lattice to a predetermined depth. For example, if the boron is ion implanted at a density of about $1 \times 10^{16}$ atoms/$cm^2$ to about $1 \times 10^{18}$ atoms/$cm^2$ with an energy of about 30 KeV to about 40 KeV, the ion-implantation is performed to form the buried impurity region 118 at a depth of about 1000 Å to about 1200 Å from an upper surface of the fin active region 116. Thus, the projection range can be controlled, thereby forming the buried impurity region 118 that is formed from a predetermined depth from an upper surface of the fin active region 116 to a depth the same or similar to a surface of the semiconductor substrate bulk 100a.

Figure 3E:
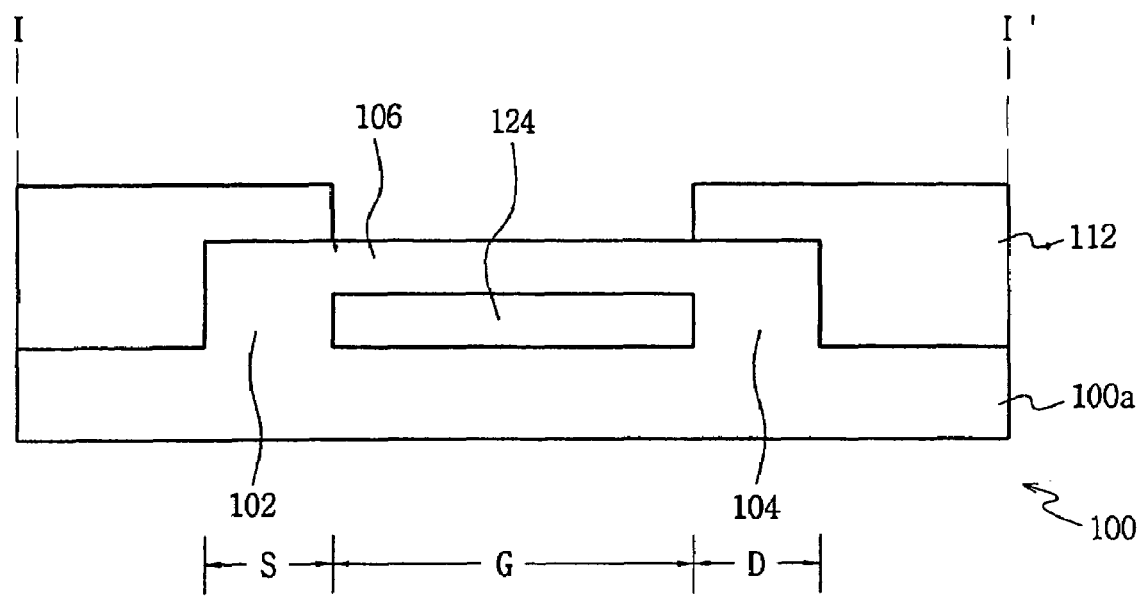
Figure 3E:
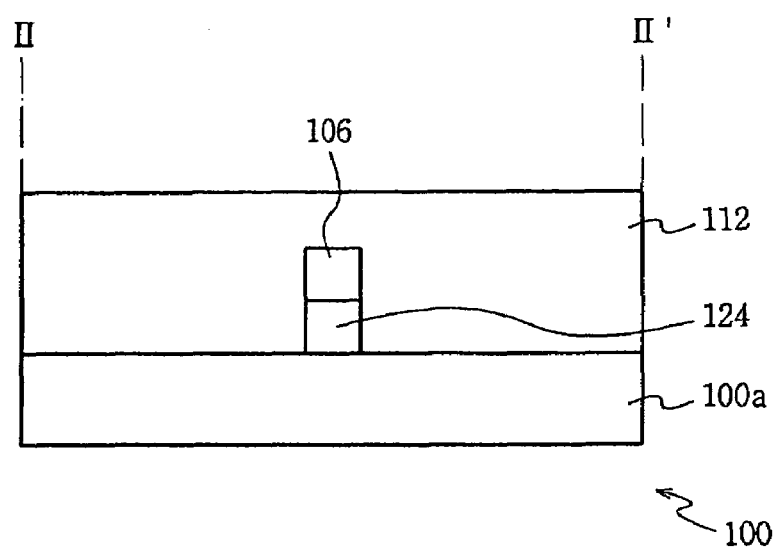

As shown in FIG. 3e, the buried impurity region (118 of FIG. 3d) is selectively isotropic-etched to form a third active region 106 with a bridge shape that is distanced from the semiconductor substrate bulk 100a and that is supported by the first and second active regions 102 and 104 provided as the fin active region 116 of the source region S and the drain region D. The isotropic etching of the buried impurity region 118 may be performed by a wet etching or a dry etching method. In the wet etching method an etchant solution may be a polysilicon enchant of HF (49%): $HNO_3$ (30%): $CH_3COOH$ (100%) (Volume 1:3:8), and the polysilicon etchant may be used to selectively remove the buried impurity region 118 in which the silicon lattice combination is cut. A reactive gas used in the dry etching method may be $CF_4$:$O_2$ (flow 60:150), and this reactive gas may be used to selectively remove the buried impurity region as compared with the semiconductor substrate bulk 100a, and the first to third active regions 102, 104, and 106 formed of the single-crystal silicon layer material. Also, though the third active region 106 is provided as a bridge shape having right-angular corners for four faces in FIG. 3e, it may be formed of a bridge type structure having a round shape without corners or having polygon corners if the dry etching or wet etching method is used. The buried impurity region 118 under the third active region 106 is removed, to form a tunnel 124 distanced between the third active region 106 and the semiconductor substrate bulk 100a.

The manufacturing method of the exemplary embodiment, therefore, can substantially reduce crystalline defects and increase the reliability of the device, by forming the third active region 106 with single-crystal silicon of the semiconductor substrate 100, as compared with the single-crystal silicon formed by an epitaxial growth method.

Next, a first conductive impurity is selectively ion-implanted in the third active region 106 by using the interlayer dielectric layer 112 as an ion implantation mask or screen, to form a third impurity region as a channel impurity region. At a width or thickness of the third active region 106 of over about 500 Å, the first conductive impurity is ion implanted to control a threshold voltage value, and at a width or thickness of the third active region 106 of under about 500 Å, the threshold voltage value is pinned uniformly depending upon only a work function of single-crystal silicon, thus the first conductive impurity is not ion implanted. In case the first conductive impurity is an accepter impurity, boron or BF2 may be used, and in case it is donor impurity, As or phosphorus may be used.

Figure 3F:
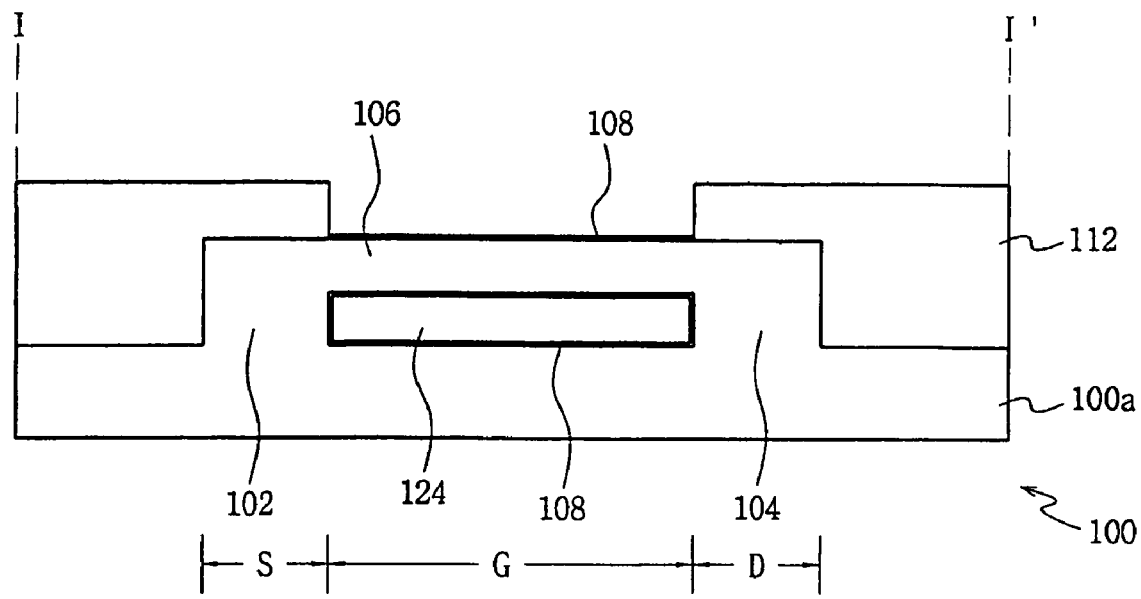
Figure 3F:
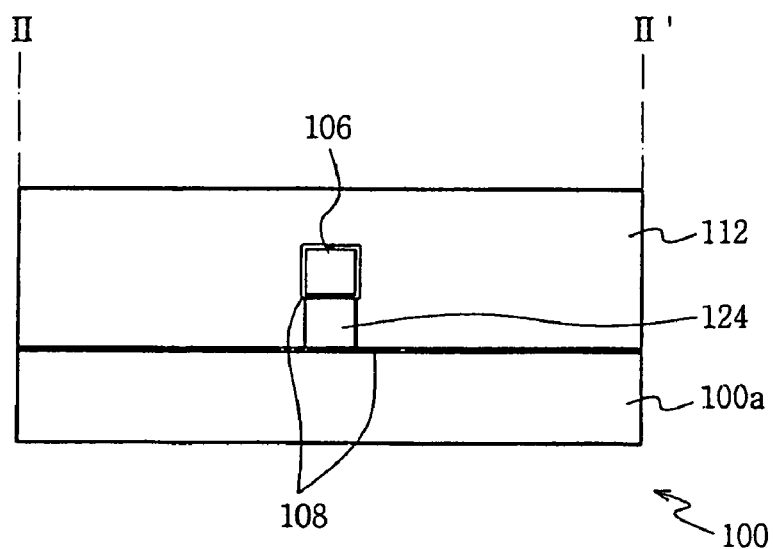

As shown in FIG. 3f, a gate insulation layer 108 of conventional gate dielectric materials such as silicon oxide is formed on the third active region 106 exposed through the interlayer dielectric layer 112. The gate insulation layer 108 is formed with the same or similar thickness, not only on the third active region 106, but also on the semiconductor substrate bulk 100a under the third active region 106. For example, the gate insulation layer 108 may be formed of silicon oxide to a thickness of less than about 130 Å, by a thermal oxidation process, on the third active region 106 and on a surface of the semiconductor substrate bulk 100a provided under the third active region 106. If the interlayer dielectric layer 112 is first formed and a center portion of the fin active region (116 of FIG. 3d) is then trimmed, the gate insulation layer 108 may be formed on sidewalls of the first and second active regions 102 and 104 adjacent to the third active region 106.

Figure 3G:
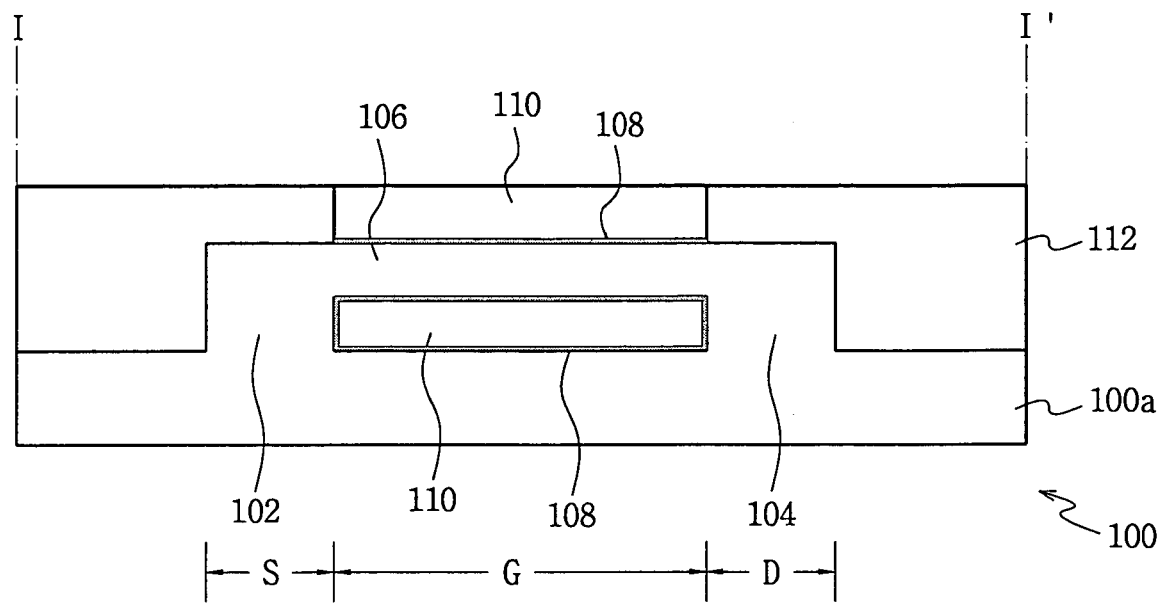
Figure 3G:
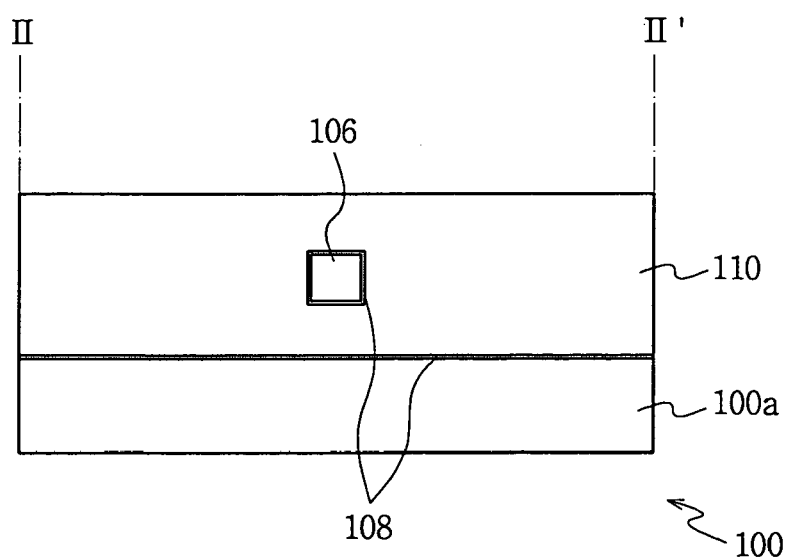

As shown in FIG. 3g, a conductive material having a predetermined thickness is formed to surround the third active region 106 on which the gate insulation layer 108 was formed. This conductive material covers the third active region 106 and the interlayer dielectric layer 112. Then, the conductive material is planarized and removed to expose the interlayer dielectric layer 112 by a chemical mechanical polishing (CMP) or dry etching method. Consequently, the gate electrode 110 is formed by a damascene method. This conductive material may be at least any one of a poly silicon layer containing a non-metal conductive impurity and a metal layer such as tungsten silicide. In forming the conductive material, the semiconductor substrate bulk 100a and the interlayer dielectric layer 112 serves as a mold capable of selectively forming the conductive material entirely on the third active region connected with the first and second active regions 102 and 104. The gate electrode 110 formed by the damascene method may be obtained, in such a way that the polysilicon containing a non-metal conductive impurity or the metal layer is formed by CVD to surround by 360° the third active region 106 selectively exposed by the interlayer dielectric layer 112 from the semiconductor substrate bulk 100a, and that the polysilicon layer or the metal layer is planarized and removed to expose the interlayer dielectric layer 112 by CMP or dry etching. Thus, the gate electrode 110 is formed in a line shape crossed with the fin active region 116 by the interlayer dielectric layer 112. At this time, a loading capacitance induced by the semiconductor substrate bulk 100a may increase by a gate voltage applied to the gate electrode 110, thus the gate insulation layer 108 between the gate electrode 110 and the semiconductor substrate bulk 100a exposed by the interlayer dielectric layer 112 should be formed to a thickness enough to reduce the loading capacitance and overcome a dielectric breakdown.

Accordingly, in the manufacturing method of the FET according to the exemplary embodiment of the invention, when patterning the gate electrode 110 filled in the tunnel 124 formed under the third active region 106 of the bridge structure, the damascene method is used instead of a conventional photolithography and etching method to reproducibly form the gate electrode 110. Thus a width of the gate electrode 110 can be easily controlled by using the interlayer dielectric layer 112 formed on the upper part and in the sidewall of the first and second active regions 102 and 104, thereby precisely controlling a length of channel influenced by the third active region 106 by a gate voltage applied to the gate electrode 110.

Figure 3H:
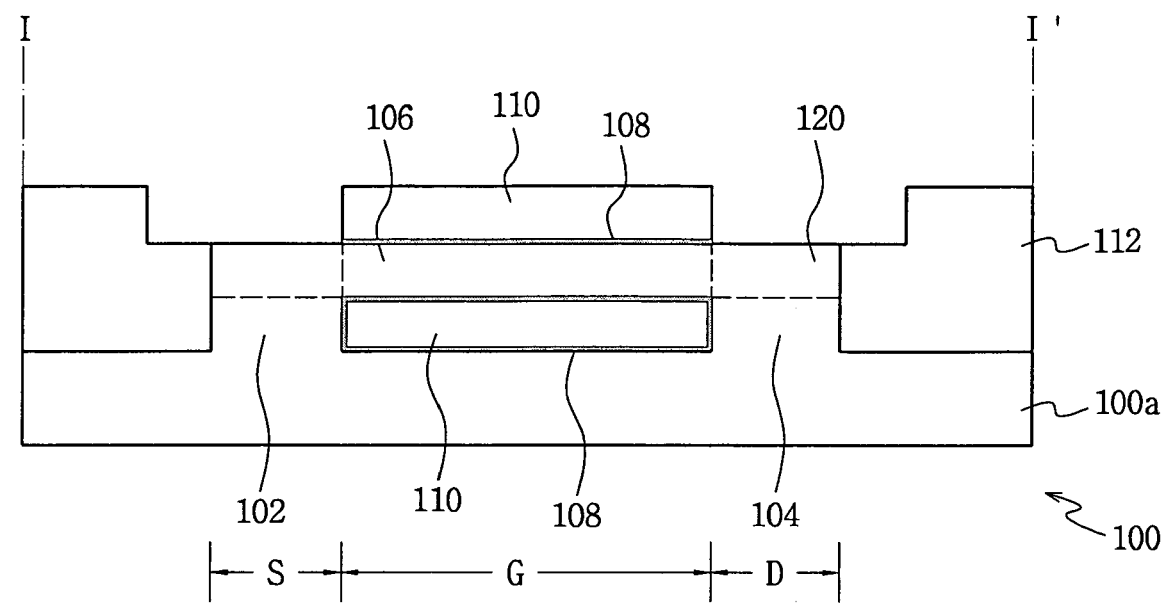
Figure 3H:
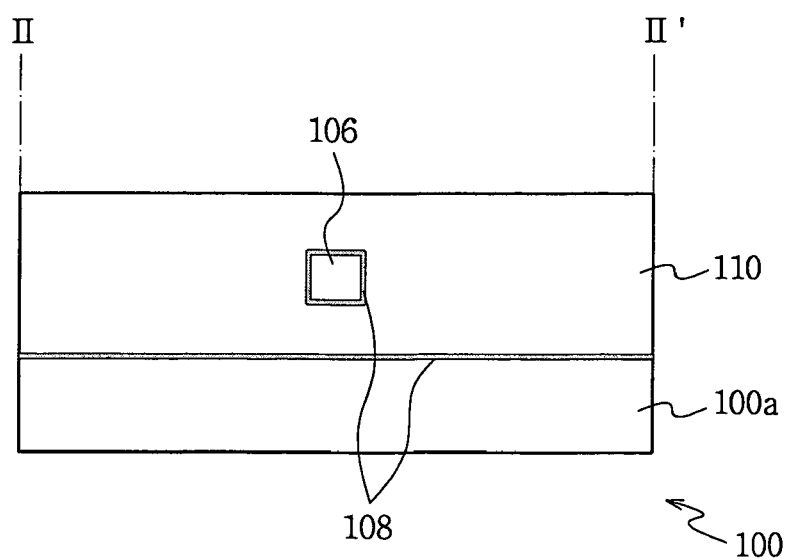

Referring to FIG. 3h, the hard mask layer (114 of FIG. 3b) and the interlayer dielectric layer 112 formed on the first and second active regions 102 and 104 are removed by a general photolithography and etching method, to expose the first and second active regions 102 and 104, and then a second conductive impurity different than to the first conductive impurity is ion implanted in the first and second active regions 102 and 104, to form a first impurity region 120. For example, the second conductive impurity is ion implanted with a density of about $1 \times 10^{12}$ atoms/cm$^2$ to about $1 \times 10^{14}$ atoms/cm$^2$, and with energy of under 50 KeV to form the first impurity region with a depth the same as or similar to the third active region 106 on the first and second active regions 102 and 104. If the first impurity region 120 is formed excessively deep as compared with the third active region 106 on the first and second active regions 102 and 104, and a gate voltage is applied to the gate electrode 110, then a channel may be formed not only in the third active region 106 but also along a surface of the semiconductor substrate bulk 100a provided under the third active region 106. Accordingly, in the manufacturing method of the FET according to the first exemplary embodiment of the invention, the first impurity region 120 is formed with a depth the same as or similar to the third active region 106 in the first and second active regions 102 and 104, thereby preventing the channel induced along the surface of the semiconductor substrate bulk 100a. In this first exemplary embodiment, the first impurity region 120 is formed of a single-crystal silicon layer, doped with a conductive impurity, thus relatively increasing an electrical conduction as compared with the polysilicon layer doped with the conductive impurity.

Subsequently, a spacer is formed on sidewalls of the gate electrode 110 adjacent to the first and second active regions 102 and 104 in which the first impurity region 120 was formed, and the second conductive impurity is ion implanted in the first and second active regions with a density of about $1 \times 10^{16}$ atoms/cm$^2$ to about $1 \times 10^{17}$ atoms/cm$^2$, by using the gate electrode 110 and the spacer as an ion implantation mask or screen, to form a second impurity region having a depth shallower than the first impurity region 120. Then, a specific interlayer dielectric layer is formed on the first and second active regions on which the second impurity region was formed and on the semiconductor substrate, and the interlayer dielectric layer provided on the second impurity region is removed to form a contact hole.

As described above, in the first exemplary embodiment, the gate electrode 110 formed entirely surrounding the third active region 106 connected with the first and second active regions 102 and 104, and a surface of the semiconductor substrate bulk 100a exposed by the interlayer dielectric layer 112, are isolated from each other only by the gate insulation layer 108, thus a gate voltage applied to the gate electrode 110 increases, and performance of the device is lowered. Therefore, an FET and a manufacturing method thereof according to a second exemplary embodiment will be described, in which the gate electrode 110 and the surface of the semiconductor substrate bulk 100a are insulated by the interlayer dielectric layer 112.

Figure 4:
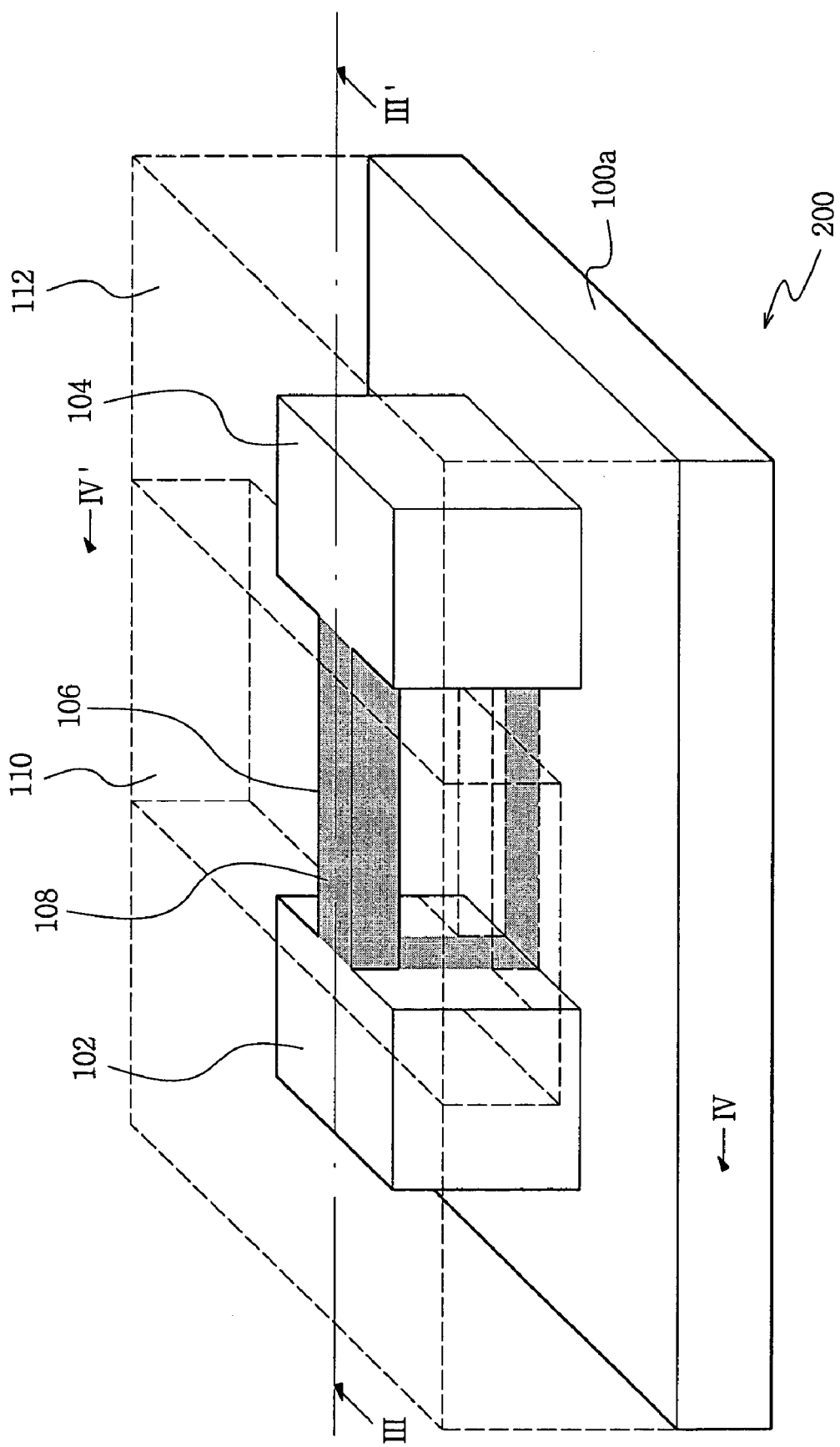
FIG. 4 is a perspective view schematically illustrating a structure of FET according to another exemplary embodiment of the invention.

FIG. 4 is a perspective view illustrating a structure of an FET according to another exemplary embodiment of the invention.

With reference to FIG. 4, in an FET according to another exemplary embodiment, first and second active regions 102 and 104 are formed being distanced from each other and protrude from an upper surface of a lower layer of the semiconductor substrate 100. The semiconductor substrate 100 is divided into a lower layer and an upper layer overlying the lower layer. The first and second active regions 102 and 104 are formed from the upper layer of the semiconductor substrate 100. The first and second active regions 102 and 104 are constructed of source and drain regions each. Also, a third active region 106 of a bridge shape is formed being distanced vertically with the upper surface of the lower layer of the semiconductor substrate 100 and being connected with the first and second active regions 102 and 104. The upper layer becomes the first and second active regions 102 and 104 that are obtained by etching the semiconductor substrate by a predetermined depth, and the third active region 106 formed with a height the same as or similar to the first and second active regions 102 and 104. The lower layer of the semiconductor substrate 100 becomes a surface of the semiconductor substrate or a bulk surface of the semiconductor substrate that supports the first and second active regions 102 and 104. Thus, the lower layer of the semiconductor substrate 100 is defined as a bulk 100a of the semiconductor substrate. The third active region 106 may be formed in a bridge shape in which the upper layer of the semiconductor substrate 100 is selectively removed by undercutting in a piercing shape by a predetermined height from the bulk 100a of the semiconductor substrate and which is supported by the first and second active regions 102 and 104. The third active region 106 is trimmed and so may be formed to have a width smaller than that of the first and second active regions 102 and 104. Thus, the first and second active regions 102 and 104 protruded from the semiconductor substrate bulk 100a, and the third active region 106 connected with the first and second active regions 102 and 104, are all formed of a single-crystal silicon layer of the same material as the semiconductor substrate 100. Also, if a second conductive impurity of non-metallic material is doped on the first and second active regions 102 and 104, to form a first impurity region (120 of FIG. 5h), the third active region 106 may be doped with a first conductive impurity contrary to the second conductive impurity. With a width or thickness of the third active region 106 of over 500 Å, a threshold voltage value can be controlled by ion implanting the first conductive impurity as a channel impurity in the third active region 106. But at a width or thickness of the third active region 106 of under 500 Å, there is an effect that a uniform threshold voltage is pinned almost without an ion implantation efficiency of the second impurity for a control of the threshold voltage value. Thus, the threshold voltage value can be decided by a work function of the single-crystal silicon layer.

A gate insulation layer 108 having a predetermined thickness is entirely formed on the third active region 106 connected with the first and second active regions 102 and 104. A gate electrode 110 is formed surrounding the third active region 106 on which the gate insulation layer 108 was formed so that the third active region 106 can function as a channel. The gate insulation layer 108 is formed of a silicon oxide layer, and the gate electrode 110 is constructed of a metal layer or a polysilicon layer doped with the non-metal first or second conductive impurity. The gate insulation layer 108 isolates the gate electrode 110 from the third active region 106, from a sidewall of the first and second active regions 102 and 104 adjacent to the third active region 106, and from a surface of the semiconductor substrate bulk 100a in a lower part of the third active region 106.

The gate electrode 110 is formed surrounding the third active region 106 through a damascene method in which the interlayer dielectric layer 112 patterned to selectively expose the third active region 106, a sidewall of the first and second active regions 102 and 104, and the semiconductor substrate bulk 100a selectively exposed by the interlayer dielectric layer 112 under the third active region 106, are used as a mold having a predetermined shape. The interlayer dielectric layer 112 is formed with over a predetermined thickness in order to insulate the gate electrode 110 from the semiconductor substrate bulk 100a. Therefore, in this exemplary embodiment the interlayer dielectric layer 112 is formed with a predetermined thickness under the gate electrode 110 to isolate the gate electrode 110 from the surface of the semiconductor substrate bulk 100a, thereby further improving an electrical characteristic as compared with the first exemplary embodiment.

Meanwhile, when a voltage is applied to the source region of the first active region 102 or the second active region 104, and a gate voltage is applied to the gate electrode 110, a channel is formed in the third active region 106 surrounded by the gate electrode. At this time, even if the first impurity region formed in the first and second active regions 102 and 104 is formed with a depth the same as or similar to, or more than the third active region 106, without an excessive depth the same as or similar to the semiconductor substrate bulk 100a, the channel can be prevented from being formed along the surface of the semiconductor substrate bulk 100a under the third active region 106.

Accordingly, in the FET according to this exemplary embodiment, the first and second active regions 102 and 104 protruded from the semiconductor substrate bulk 100a, and the third active region 106 of a bridge shape connected with the first and second active regions 102 and 104, are formed of a single-crystal silicon layer of the semiconductor substrate 100, thereby reducing a crystalline defect as compared with a single-crystal silicon layer grown by a conventional epitaxial growth method. This results in improved electrical characteristic and increased reliability of devices.

A method of manufacturing the FET according to this exemplary embodiment will be described as follows.

FIGS. 5a to 5h are sectional views sequentially illustrating processes taken along III~III' and IV~IV' in manufacturing the transistor of FIG. 4.

Figure 5A:
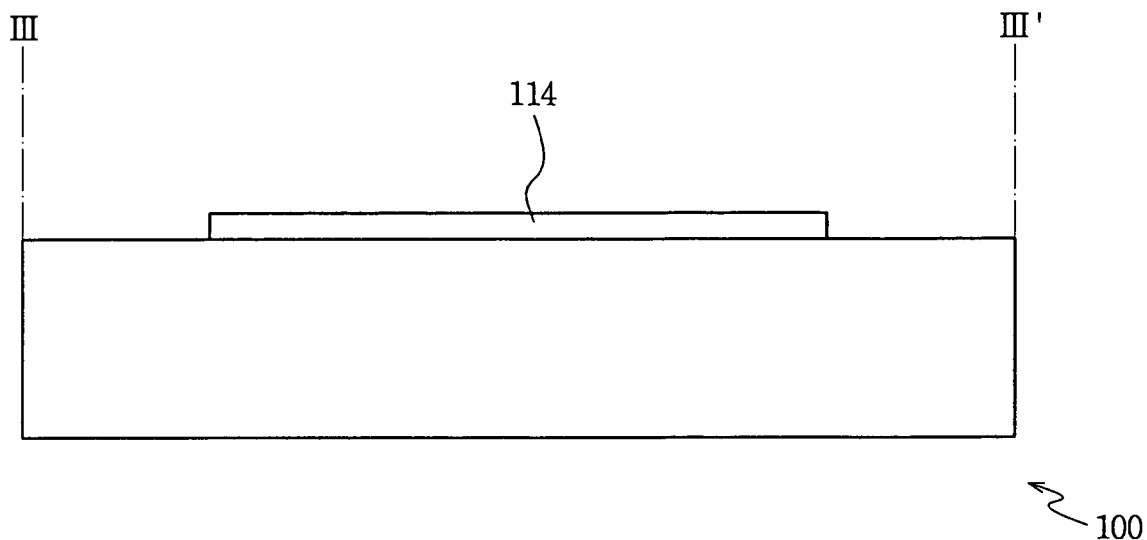
FIGS. 5a to 5h are sectional views sequentially illustrating processes taken along III~III' and IV~IV' in manufacturing the transistor in FIG. 4.
Figure 5A:
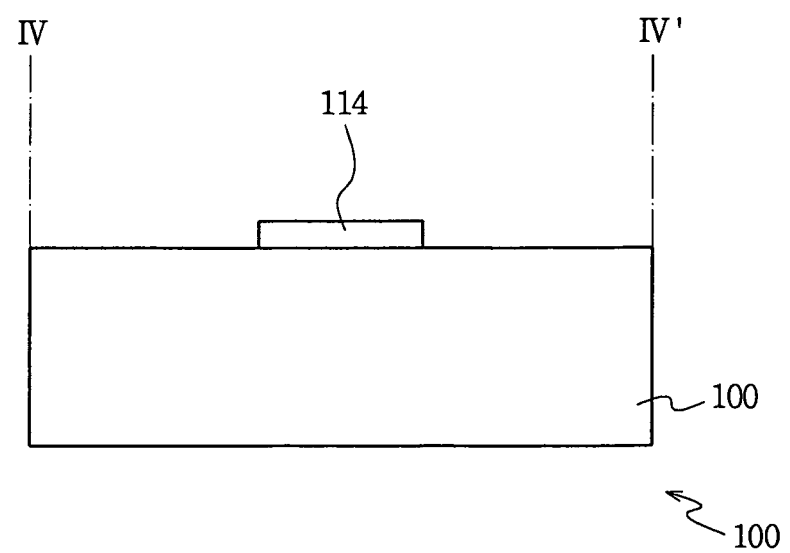

As shown in FIG. 5a, a hard mask layer 114 having a predetermined thickness is formed on the semiconductor substrate 100 of the single-crystal silicon material by CVD, and is then patterned by a general photolithography and etching process. The hard mask layer 114 is formed of a silicon nitride layer or silicon oxynitride layer. If the hard mask layer 114 is formed of a silicon oxynitride layer, then an anti-reflective layer may be formed on the silicon oxynitride layer, and then this is patterned by the photolithography and etching process. Although not shown in the drawing, an etch stop layer having a predetermined thickness is further formed of a silicon oxide layer between the semiconductor substrate and the hard mask layer 114, and when the hard mask layer 114 is removed, a profile can be improved. For example, the hard mask layer 114 is formed with a thickness under about 1000 Å, and the silicon oxide layer has a thickness under about 500 Å. At this time, an anti-reflective layer having a predetermined thickness may be further formed on the hard mask layer 114, to prevent a diffused reflection in an exposure procedure of photoresist formed on the hard mask layer 114 in the photolithography and etching procedure. The photolithography and etching process may employ a dry etching method to pattern the hard mask layer 114, and a reactive gas used in the dry etching method is used as a gas having a relatively sufficient selection etching rate for the hard mask layer 114 as compared with the etch stop layer or the single-crystal silicon of the semiconductor substrate 100.

Figure 5B:
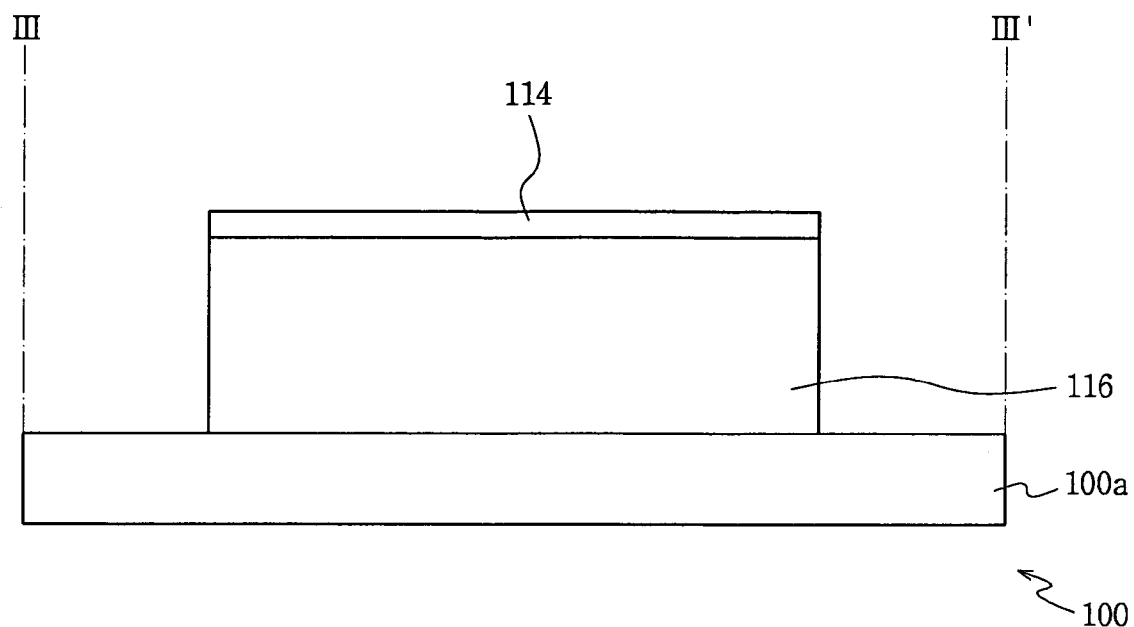
Figure 5B:
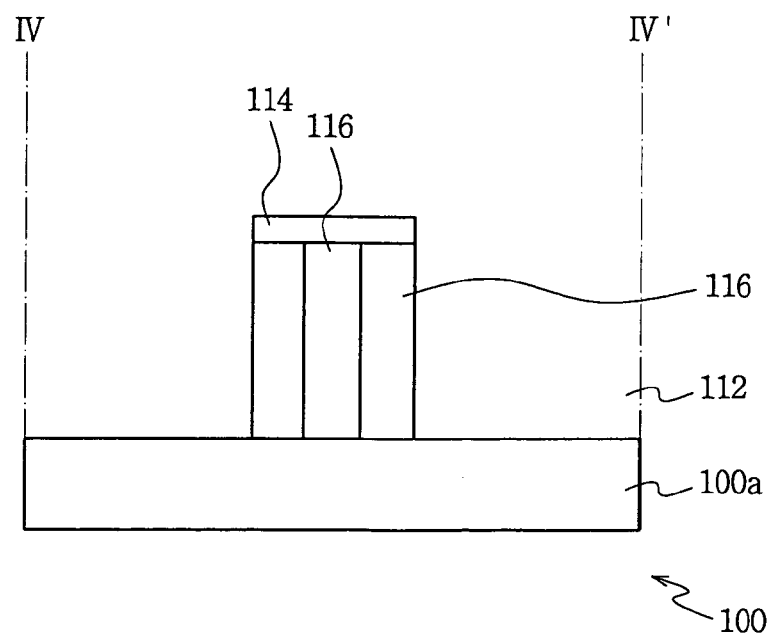

As shown in FIG. 5b, the semiconductor substrate 100 is etched to a predetermined depth by using the hard mask layer 114 as an etch mask. This forms, under the hard mask layer 114, a fin active region 116 having a predetermined height from a surface of the semiconductor substrate bulk 100a. This etching of the semiconductor substrate 100 employs a dry etching method having a sufficient vertical etching characteristic. That is, the semiconductor substrate 100 is removed by a predetermined depth for a predetermined time by a time etch method, so that the fin active region 116 is protruded with a predetermined height. For example, the fin active region 116 is formed to have a height of over about 3000 Å from a surface of the semiconductor substrate bulk 100a.

A line width of the hard mask layer 114 formed on an upper central portion of the fin active region 116 is reduced by a general photolithography and etching method, and a center portion of the fin active region 116 is trimmed by using the hard mask layer 114 as an etch mask, to reduce a line width, and the hard mask layer 114 is removed.

Figure 5C:
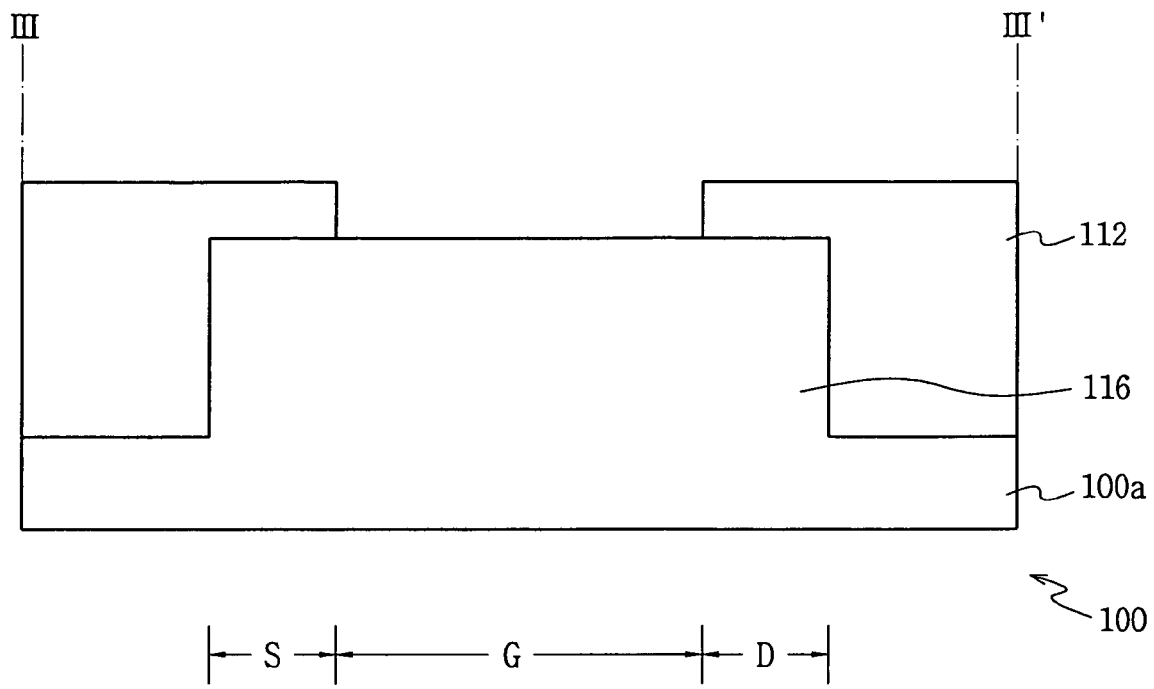
Figure 5C:
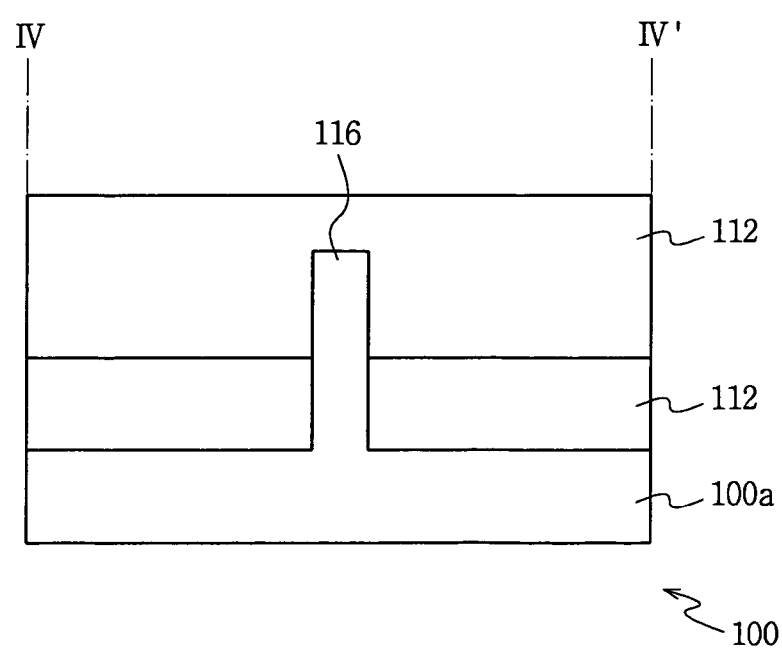

In FIG. 5c, an interlayer dielectric layer (ILD) 112 of CVD silicon oxide is formed on the semiconductor substrate 100 on which the fin active region 116 was formed. The interlayer dielectric layer 112 is planarized by CMP, and is removed by a predetermined thickness to expose a predetermined portion of the fin active region 116 of a gate region G by using a general photolithography and etching method. For example, the interlayer dielectric layer 112 is formed to have a thickness of about 4000 Å to about 8000 Å. The photolithography and etching method for exposing the fin active region 116 of the gate region G includes processes of entirely depositing the semiconductor substrate 100 on which the interlayer dielectric layer 112 was formed, with a photoresist; patterning the photoresist so that the photoresist is selectively left on both ends of the fin active region 116 corresponding to source region S and drain region D; and removing the interlayer dielectric layer 112 to expose a predetermined portion of the fin active region 116 of the gate region G, by a dry etching method of time-etching the interlayer dielectric layer 112 for a predetermined time by using the photoresist as an etch mask or screen. The interlayer dielectric layer 112 left on the fin active region 116 corresponding to the source region S and the drain region D is later used to form the gate electrode 110 (of FIG. 2) through a damascene method when the gate electrode 110 is formed. Also, the fin active region 116 provided under the interlayer dielectric layer 112 becomes each the first and second active regions (102 and 104 of FIG. 4). Although not shown in the drawing, if a center portion of the fin active region 116 is not trimmed and the hard mask layer (114 of FIG. 5b) is not removed, then a center portion of the fin active region 116 exposed by the interlayer dielectric layer 112 may be trimmed, thus further reducing a line width of the center portion of the fin active region 116 relative to a line width of both ends of the fin active region 116. Then, the hard mask layer 114 exposed by the interlayer dielectric layer 112 may be removed.

Figure 5D:
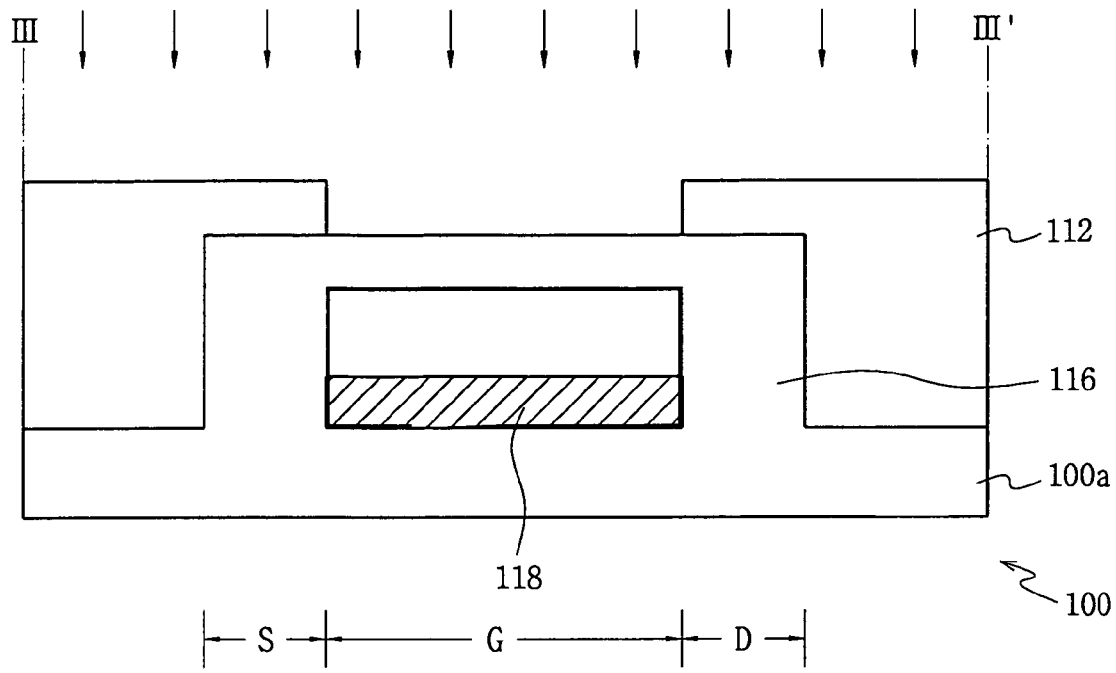
Figure 5D:
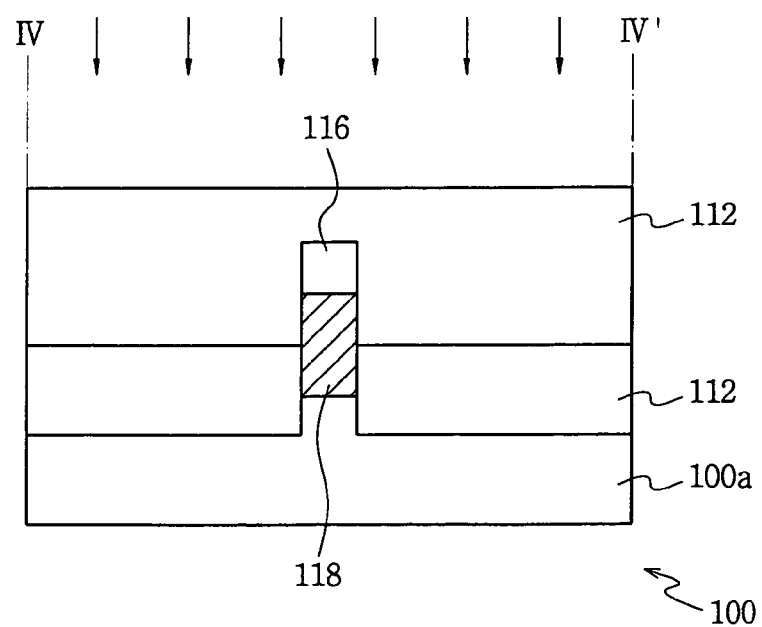

In FIG. 5d, an impurity is selectively ion-implanted in the fin active region 116 of the gate region G by using the interlayer dielectric layer 112 as an ion implantation mask or screen, to thus form a buried impurity region 118. The interlayer dielectric layer 112 is formed on an upper part and on sidewalls of the fin active region 116 corresponding to the source region S and the drain region D. This buried impurity may be any one of non-metallic conductive impurities such as boron, $BF_2$, or phosphorous, and of a low mass element such as H and He having a low atomic mass. The impurity is ion-implanted with a predetermined projection range into the fin active region 116 formed of single-crystal silicon, and penetrates the silicon lattice to a predetermined depth. For example, if the boron is ion implanted at a density of about $1\times10^{16}$ atoms/cm$^2$ to about $1\times10^{18}$ atoms/cm$^2$, with and energy of about 60 KeV to about 80 KeV, the ion-implantation is performed to form the buried impurity region 118 at a depth of about 2000 Å to about 2500 Å from an upper surface of the fin active region 116. Thus, the projection range can be controlled, thereby forming the buried impurity region 118 that is formed from a predetermined depth the same as or similar to the interlayer dielectric layer 112 from an upper surface of the fin active region 116, to a depth the same as or similar to a surface of the semiconductor substrate bulk 100a.

Figure 5E:
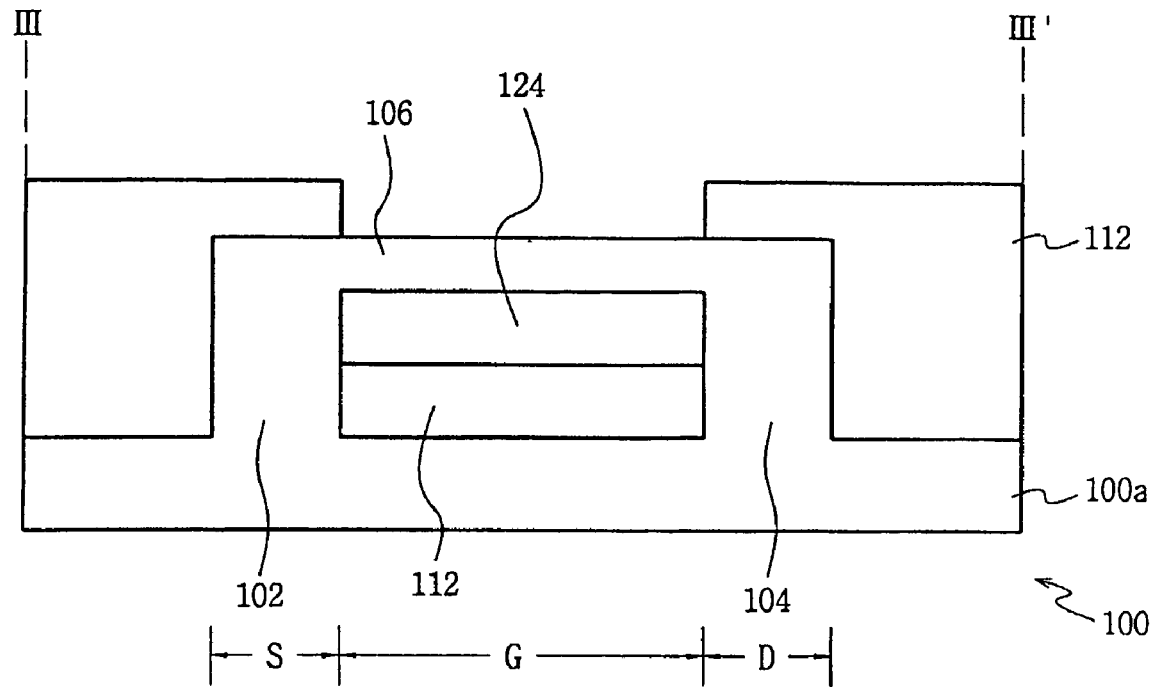
Figure 5E:
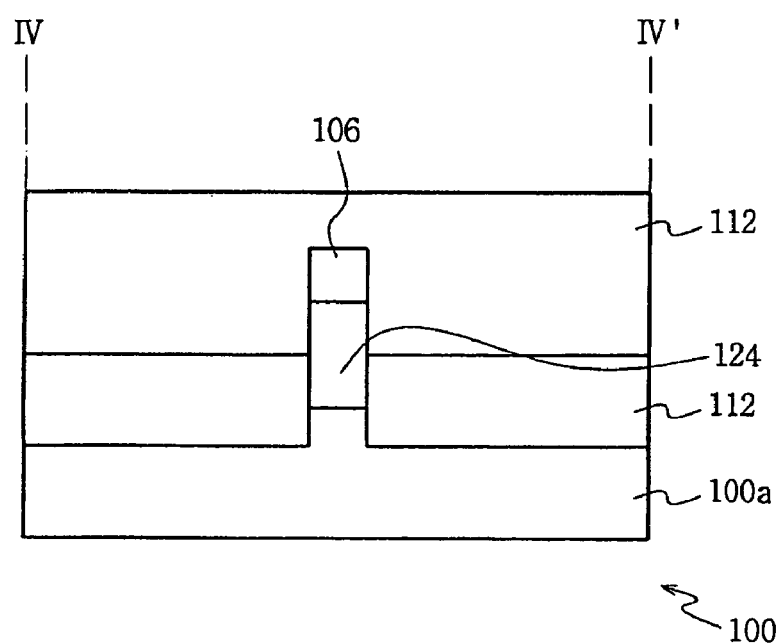

As shown in FIG. 5e, the buried impurity region (118 of FIG. 5d) is selectively isotropic-etched to form a third active region 106 with a bridge shape structure that is distanced by a predetermined distance from the semiconductor substrate bulk 100a and that is supported by the first and second active regions 102 and 104 provided as the fin active region 116 (of FIG. 5c) of the source region S and the drain region D. The isotropic etching of the buried impurity region 118 may be performed by a wet etching or a dry etching method. In the wet etching method an etchant solution may be a polysilicon etchant of HF (49%): $HNO_3$ (30%): $CH_3COOH$ (100%) (Volume 1:3:8), and the polysilicon etchant may be used to selectively remove the buried impurity region 118 in which the silicon lattice combination was cut. A reactive gas used in the dry etching method may be $CF_4$:$O_2$ (flow 60:150), and this reactive gas may be used to selectively remove the buried impurity region as compared with the semiconductor substrate bulk 100a, and the first to third active regions 102, 104, and 106 formed of the single-crystal silicon layer material. The third active region 106 is formed to have a tunnel 124 distanced by a predetermined distance from a surface of the semiconductor substrate bulk 100a. Also, though the third active region 106 is provided as a bridge shape having right-angular corners for four faces in FIG. 5e, it may be formed of a bridge type structure having a round shape without corners, or having polygon corners if the third active region 106 is formed by the isotropic etching of the buried impurity region 118 (using the dry etching or wet etching method). The buried impurity region 118 under the third active region 106 is removed, to form the tunnel 124 distanced between the third active region 106 and the semiconductor substrate bulk 100a.

The manufacturing method of the exemplary embodiment, therefore, can substantially reduce crystalline defects and increase the reliability of the device, by forming the third active region 106 with single-crystal silicon of the semiconductor substrate 100, as compared with single-crystal silicon formed by an epitaxial growth method.

Next, a first conductive impurity is selectively ion-implanted in the third active region 106 by using the interlayer dielectric layer 112 as an ion implantation mask or screen, to form a third impurity region as a channel impurity region. At a width or thickness of the third active region 106 of over about 500 Å, the first conductive impurity is ion implanted to control a threshold voltage value, and at a width or thickness of the third active region 106 of under about 500 Å, the threshold voltage value is pinned uniformly depending upon only a work function of single-crystal silicon, thus the first conductive impurity is not ion implanted. In case the first conductive impurity is an accepter impurity, boron, or BF2 may be, and in case it is a donor impurity, As or phosphorus may be used.

Figure 5F:
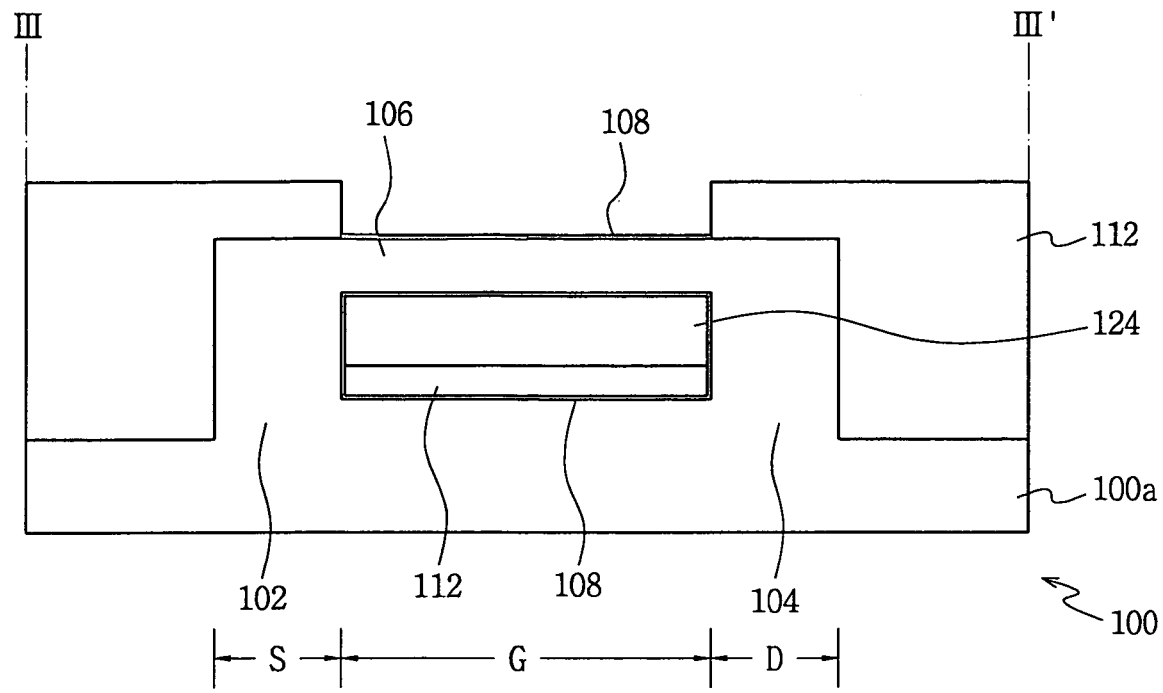
Figure 5F:
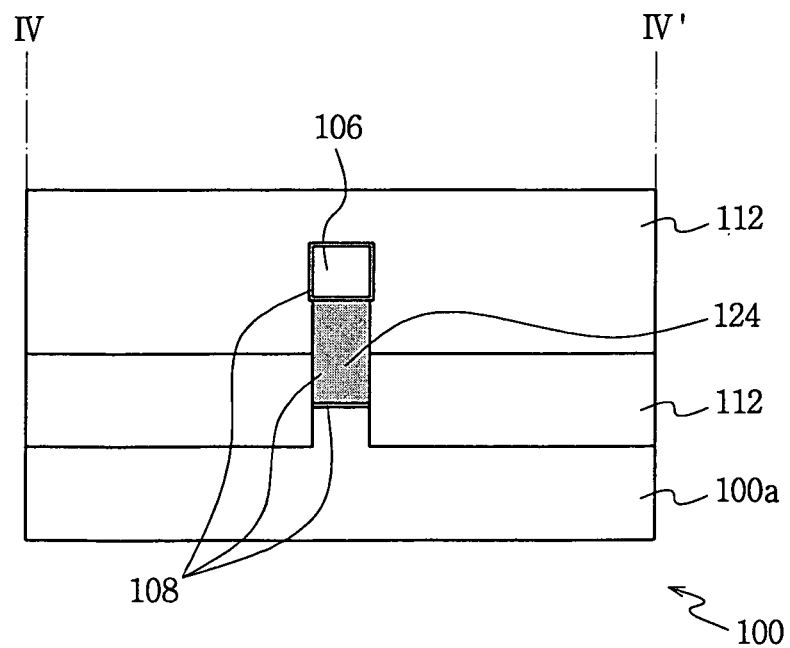

As shown in FIG. 5f, a gate insulation layer 108 having a predetermined thickness is formed of a silicon oxide layer, entirely on the third active region 106 exposed by the interlayer dielectric layer 112. The gate insulation layer 108 is formed with the same or similar thickness, not only on the third active region 106, but also on the semiconductor substrate bulk 100a provided under the third active region 106. For example, the gate insulation layer 108 may be formed of a silicon oxide layer with a thickness of under about 130 Å, by a thermal oxidation process, on the third active region 106 and on a surface of the semiconductor substrate bulk 100a provided under the third active region 106. If the interlayer dielectric layer 112 is first formed and a center portion of the fin active region (116 of FIG. 3d) is then trimmed, the gate insulation layer 108 may be formed on sidewalls of the first and second active regions 102 and 104 adjacent to the third active region 106.

Figure 5G:
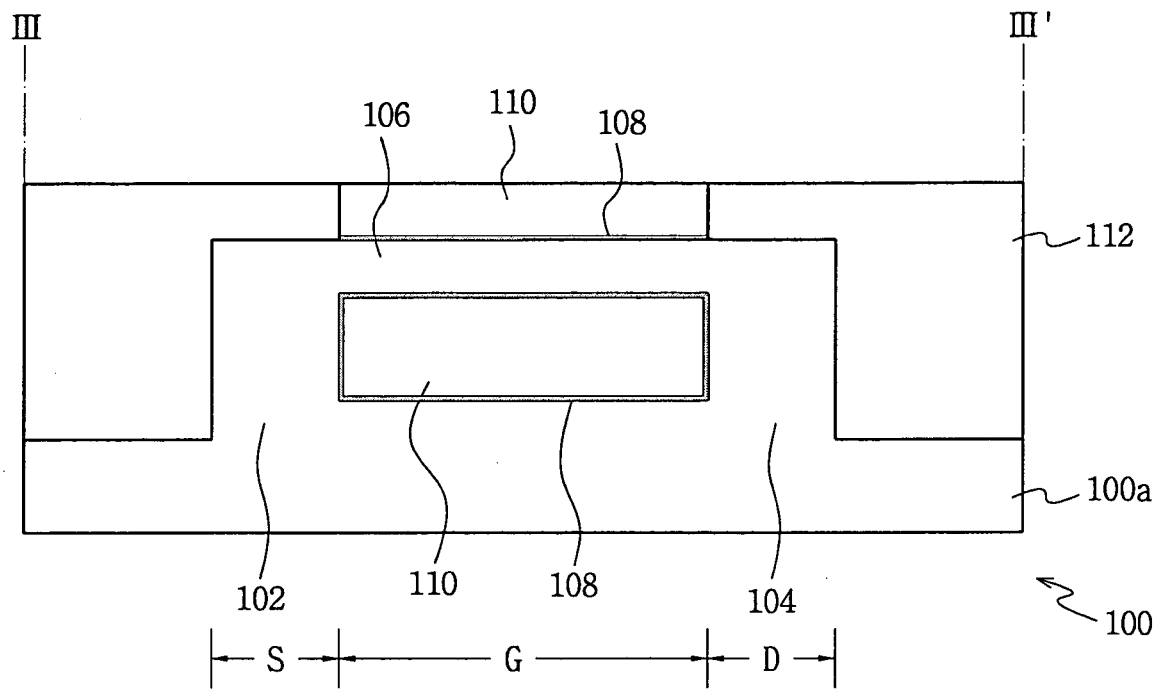
Figure 5G:
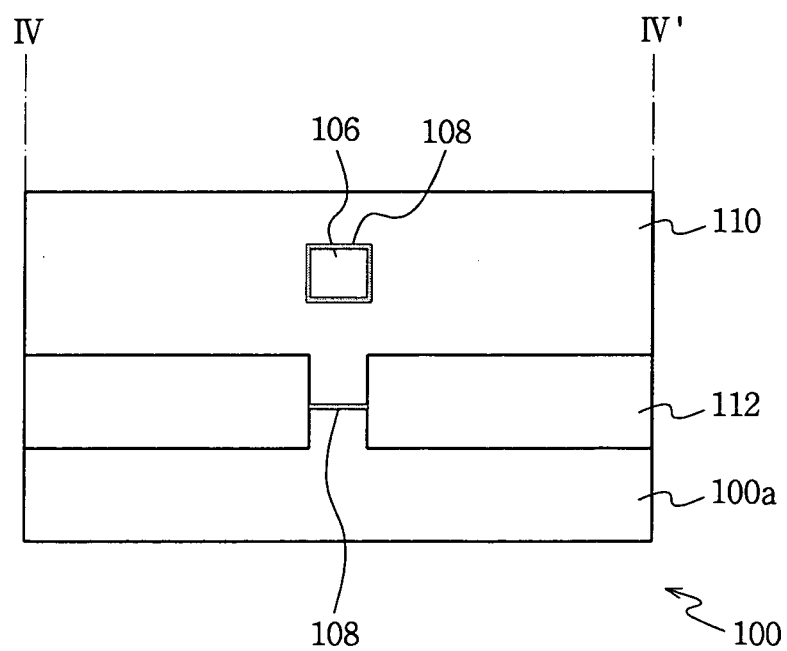

As shown in FIG. 5g, conductive material having a predetermined thickness is formed to entirely surround the third active region 106 on which the gate insulation layer 108 was formed. This conductive material is formed covering an entire face of the third active region 106 and the interlayer dielectric layer 112. Then, the conductive material is planarized and removed to expose the interlayer dielectric layer 112 by a CMP or dry etching method, to subsequently form the gate electrode 110 through a damascene method. This conductive material may become a polysilicon layer containing a non-metal conductive impurity or a metal layer such as tungsten silicide. In forming the conductive material, the semiconductor substrate bulk 100a and the interlayer dielectric layer 112 serves as a mold capable of selectively forming the conductive material entirely on the third active region 106 connected with the first and second active regions 102 and 104. The gate electrode 110 formed by the damascene method may be obtained in such a way that the polysilicon containing a non-metal conductive impurity or the metal layer is formed by a CVD to entirely surround by 360° the third active region 106 selectively exposed by the interlayer dielectric layer 112 from the semiconductor substrate bulk 100a, and that the polysilicon layer or the metal layer is planarized and removed to expose the interlayer dielectric layer 112 by CMP or dry etching. Thus, the gate electrode 110 is formed in a line shape crossed with the fin active region 116 by the interlayer dielectric layer 112. At this time, if the polysilicon layer is used as the gate electrode 110, conductive impurity may be doped in the midst of forming the polysilicon layer by CVD, or the non-metal conductive impurity may be ion-implanted and doped after first forming the polysilicon layer.

Accordingly, in the manufacturing method of the FET according to the exemplary embodiment, when patterning the gate electrode 110 filled in the tunnel 124 formed under the third active region 106 of the bridge structure, the damascene method is used instead of a conventional photolithography and etching method, to reproducibly form the gate electrode 110. Further, a width of the gate electrode 110 can be easily controlled by using the interlayer dielectric layer 112 that is formed on the upper part and in the sidewall of the first and second active regions 102 and 104, thereby precisely controlling a length of channel induced by the third active region 106 by a gate voltage applied to the gate electrode 110.

In addition, the semiconductor substrate bulk 100a, except a lower part of the third active region 106, is isolated from the gate electrode 110 by the interlayer dielectric layer 112. Thus the FET of the exemplary embodiment can further improve an electrical characteristic as compared with the previous exemplary embodiment.

Figure 5H:
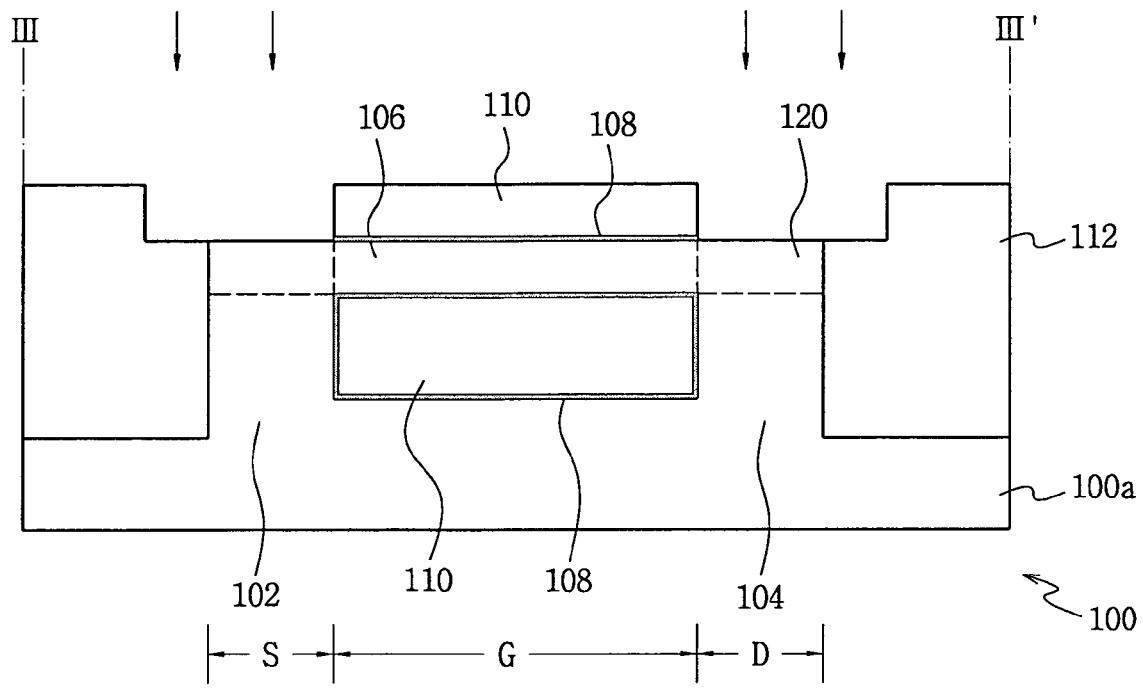
Figure 5H:
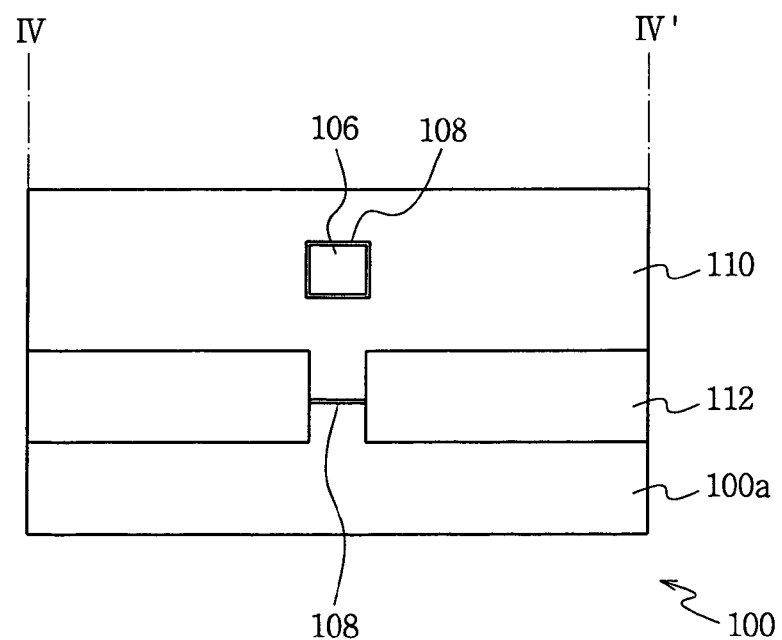

Referring to FIG. 5h, the interlayer dielectric layer 112 formed on the first and second active regions 102 and 104 is removed by a general photolithography and etching method, to expose the first and second active regions 102 and 104, and then a second conductive impurity different than the first conductive impurity is ion implanted in the first and second active regions 102 and 104, to form a first impurity region 120. For example, the second conductive impurity is ion implanted with a density of about $1 \times 10^{12}$ atoms/cm$^2$ to about $1 \times 10^{14}$ atoms/cm$^2$, and with an energy of under 50 KeV to form the first impurity region with a depth the same as or similar to the third active region 106 on the first and second active regions 102 and 104. If the first impurity region 120 formed on the first and second active regions 102 and 104 is formed excessively deep, to a depth similar to the semiconductor substrate bulk, and a gate voltage is applied to the gate electrode 110, then a channel may be formed not only in the third active region 106 but also along a surface of the semiconductor substrate bulk 100a provided under the third active region 106. Accordingly, in the manufacturing method of the FET according to the secondary embodiment, the first impurity region 120 is formed with a depth the same as or similar to the third active region 106 in the first and second active regions 102 and 104, thereby preventing the channel induced along the surface of the semiconductor substrate bulk 100a. In this exemplary embodiment, the first impurity region 120 is formed of single-crystal silicon layer doped with a conductive impurity, thus relatively increasing an electrical conduction as compared with polysilicon layer doped with conductive impurity.

Subsequently, a spacer is formed on sidewalls of the gate electrode 110 adjacent to the first and second active regions 102 and 104 in which the first impurity region 120 was formed, and the second conductive impurity is ion implanted in the first and second active regions with a density of about $1 \times 10^{16}$ atoms/cm$^2$ to about $1 \times 10^{17}$ atoms/cm$^2$, by using the gate electrode 110 and the spacer as an ion implantation mask or screen, to form a second impurity region having a depth shallower than the first impurity region 120. Then, a specific interlayer dielectric layer is entirely formed on the first and second active regions on which the second impurity region was formed and on the semiconductor substrate, and the interlayer dielectric layer provided on the second impurity region is removed to form a contact hole.

As described above, in the previous two exemplary embodiments, if the first impurity region 120 formed on the first and second active regions 102 and 104 is formed excessively deep to a depth similar to the semiconductor substrate bulk 100a, with a depth similar to the third active region 106, or a gate voltage applied to the gate electrode 110 increases; a channel may be formed along a surface of the semiconductor substrate bulk provided under the gate electrode 110. Thus, to prevent it, a manufacturing method thereof will be described according to another exemplary embodiment of the invention, as follows.

Figure 6:
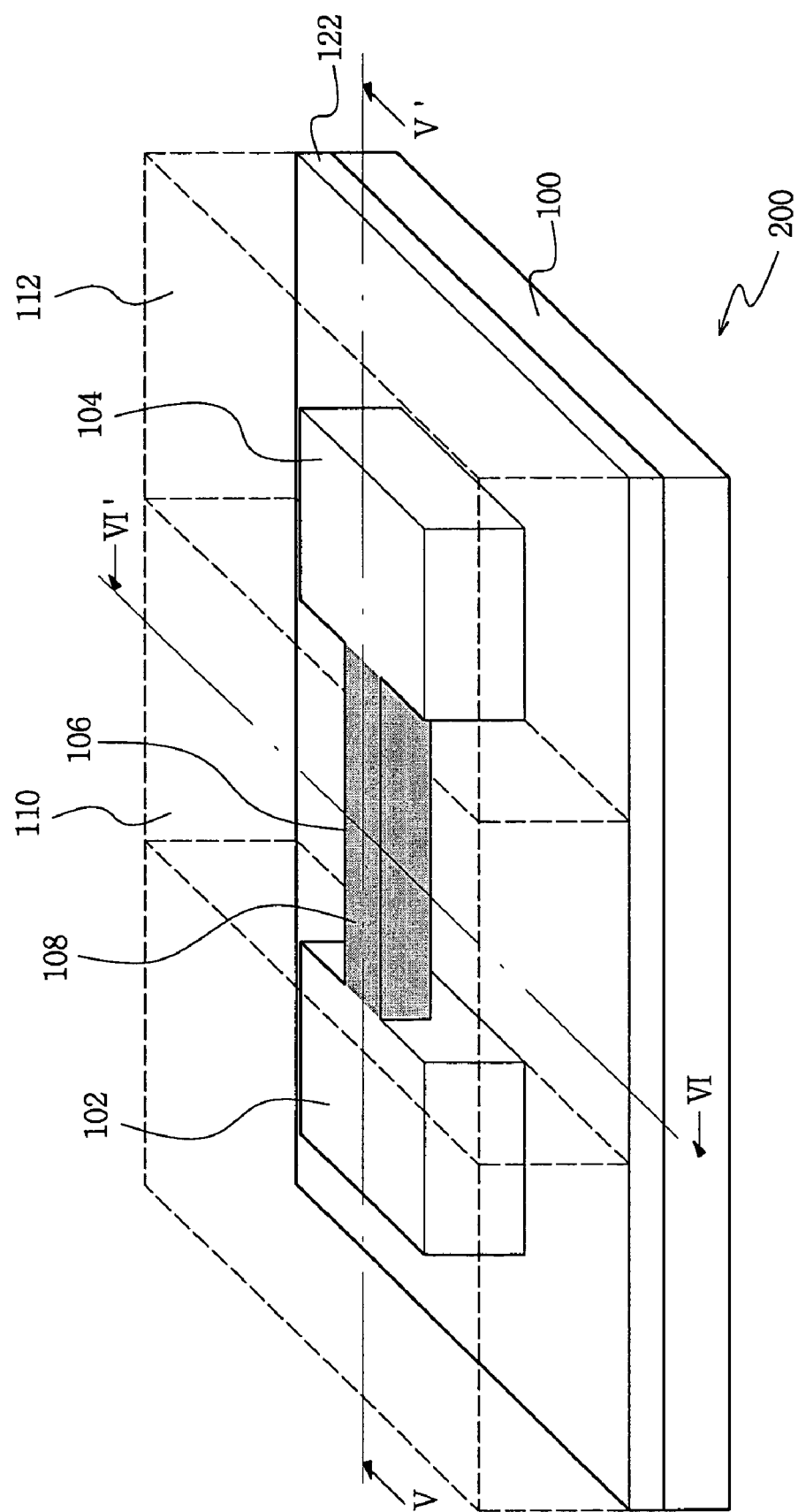
FIG. 6 is a perspective view schematically illustrating a structure of FET according to yet another exemplary embodiment of the invention.

FIG. 6 is a perspective view illustrating a structure of an FET according to another exemplary embodiment of the invention.

With reference to FIG. 6, in an FET according to this exemplary embodiment, first and second active regions 102 and 104 are distanced from each other on a substrate insulation layer 122 of an SOI (Silicon On Insulator) type silicon substrate 200. The SOI type silicon substrate 200 is obtained by interposing the substrate insulation layer 122 such as a silicon oxide layer between a general silicon substrate 100 and a single-crystal silicon layer, or single-crystal silicon film having a predetermined thickness and then by bonding therebetween. Devices can be completely separated electrically by using the SOI type silicon substrate 200, thus adjacent devices based on a high integration can be prevented from influencing one another. Furthermore, a use of the SOI type silicon substrate 200 provides advantages: problems caused by a current generation of a bonding part can be reduced, under such an environment that an internal pressure is higher in comparison with a device region separation system of a bonding method, and that radiation is high. For example, a thickness of a single-crystal silicon layer or a single-crystal silicon film is from about 500 Å to under about 5000 Å. That is, in the FET of the exemplary embodiment, the first and second active regions 102 and 104 are formed being protruded from the substrate insulation layer 122 by using the single-crystal silicon layer or film of the SOI type silicon substrate 200. These first and second active regions 102 and 104 are each constructed of a source region and a drain region. Herewith, the substrate insulation layer 122 of the SOI type silicon substrate 200 is represented as a general silicon substrate 100.

Further, a third active region 106 is formed being vertically distanced from an upper surface of the substrate insulation layer 122, in a bridge shape connected with the first and second active regions 102 and 104. The third active region 106 may be formed in the bridge shape that is undercut by selectively removing the single-crystal silicon layer or film by a predetermined height from the substrate insulation layer 122, and then be supported by the first and second active regions 102 and 104. The third active region 106 is trimmed to have a width smaller than a width of the first and second active regions 102 and 104. Thus, the first and second active regions 102 and 104 formed on the substrate insulation layer 122, and the third active region 106 connected with the first and second active regions 102 and 104, are all formed of a single-crystal silicon layer or a single-crystal silicon film. A non-metallic first conductive impurity is doped on the first and second active regions 102 and 104 to form a first impurity region. The third active region 106 may be doped with a second conductive impurity different than the first conductive impurity, to form a channel impurity region. At a width or thickness of the third active region 106 of over 500 Å, a threshold voltage value can be controlled by ion implanting the second conductive impurity as a channel impurity in the third active region 106, but at a width or thickness of the third active region 106 of under 500 Å, there is an effect that a given threshold voltage is pinned almost without an ion implantation efficiency of the second impurity for a control of the threshold voltage value. Thus, the threshold voltage value can be decided by a work function of the single-crystal silicon layer.

A gate insulation layer 108 having a predetermined thickness is entirely formed on the third active region 106 connected with the first and second active regions 102 and 104, and a gate electrode 110 is formed overall surrounding the third active region 106 on which the gate insulation layer 108 was formed so that the third active region 106 could function as a channel. The gate insulation layer 108 is formed of a silicon oxide layer, and the gate electrode 110 is constructed of a metal layer or a polysilicon layer doped with the non-metal first or second conductive impurity.

The gate electrode 110 is formed surrounding the third active region 106 by a damascene method instead of a general photolithography process. A sidewall of the first and second active regions adjacent to the third active region 106, the interlayer dielectric layer 112 that surrounds upper parts and side face of the first and second active regions 102 and 104 are used. The interlayer dielectric layer 112 is patterned in a predetermined shape, and the substrate insulation layer 122 is exposed by the interlayer dielectric layer 112. This interlayer dielectric layer 112 is formed of a silicon oxide layer having a component ratio the same as or similar to the substrate insulation layer 122 and the gate insulation layer 108.

Meanwhile, when a voltage is applied to the source region of the first active region 102 or the second active region 104, and a gate voltage is applied to the gate electrode 110, a channel is formed in the third active region 106 surrounded by the gate electrode 110. The gate electrode 110 is electrically isolated from the silicon substrate 100 by the substrate insulation layer 122.

Therefore, in the FET according to this exemplary embodiment, the gate electrode 110 can be completely independent and insulated from the silicon substrate 100 by the use of the substrate insulation layer 122, thereby further improving an electrical characteristic as compared with the previous two exemplary embodiments.

Furthermore, the first and second active regions 102 and 104 protruded from the semiconductor substrate bulk 100a, and the third active region 106 of a bridge shape connected with the first and second active regions 102 and 104, are formed of a single-crystal silicon layer or film of the SOI type silicon substrate 200, thereby substantially reducing a crystalline defect as compared with the single-crystal silicon layer grown by a conventional epitaxial growth method. That is, an electrical characteristic is improved and the reliability of the device is increased.

A method of manufacturing the FET according to this exemplary embodiment will be described as follows.

FIGS. 7a to 7h are sectional views sequentially illustrating processes taken along V~V' and VI~VI' in manufacturing the transistor of FIG. 6.

Figure 7A:
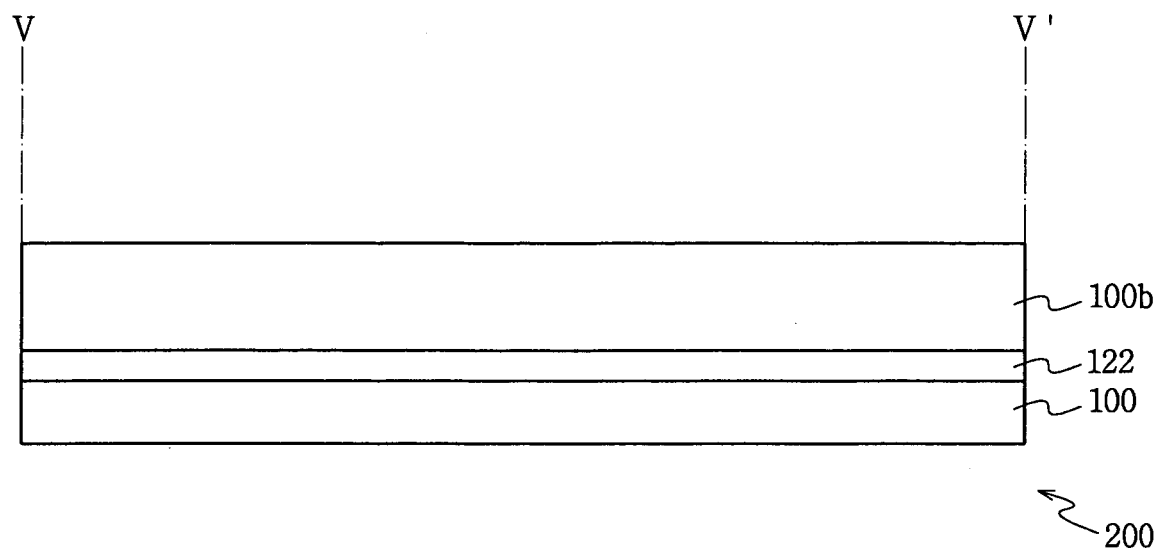
FIGS. 7a to 7h are sectional views sequentially illustrating processes taken along V~V' and VI~VI' in manufacturing the transistor in FIG. 6.
Figure 7A:
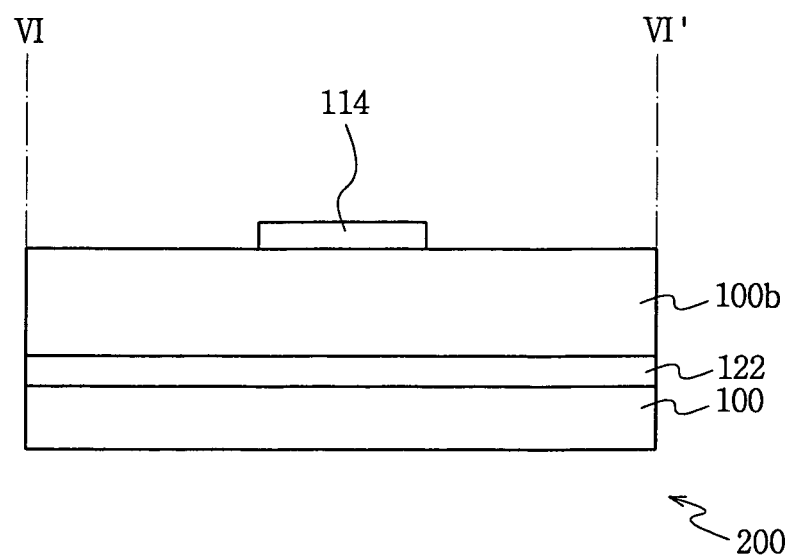

As shown in FIG. 7a, a hard mask layer 114 having a predetermined thickness is formed on the SOI type silicon substrate 200, and is then patterned by a general photolithography and etching process. The SOI type silicon substrate 200 is composed of a general silicon substrate 100 of single-crystal silicon material, the substrate insulation layer 122 has a predetermined thickness on the silicon substrate 112, and a single-crystal silicon layer 100a or a single-crystal silicon film. The hard mask layer 114 is formed of a silicon nitride layer or silicon oxynitride layer. If the hard mask layer 114 is formed of the silicon oxynitride layer, an anti-reflective layer is formed on the silicon oxynitride layer, and then this is patterned by the photolithography and etching process. Although not shown in the drawing, an etch stop layer having a predetermined thickness is further formed of a silicon oxide layer between the SOI type silicon substrate 200 and the hard mask layer 114. When the hard mask layer 114 is removed, a profile can be improved. For example, the hard mask layer 114 is formed to have a thickness under about 1000 Å, and the silicon oxide layer has a thickness under about 500 Å. At this time, an anti-reflective layer having a predetermined thickness may be further formed on the hard mask layer 114, to prevent a diffused reflection in an exposure procedure of photoresist formed on the hard mask layer 114 in the photolithography and etching procedure. The photolithography and etching process may employ a dry etching method to pattern the hard mask layer 114, and reactive gas used in the dry etching method is used as gas having a prominent selection etching rate for the hard mask layer 114 as compared with the etch stop layer or the single-crystal silicon of the semiconductor substrate.

Figure 7B:
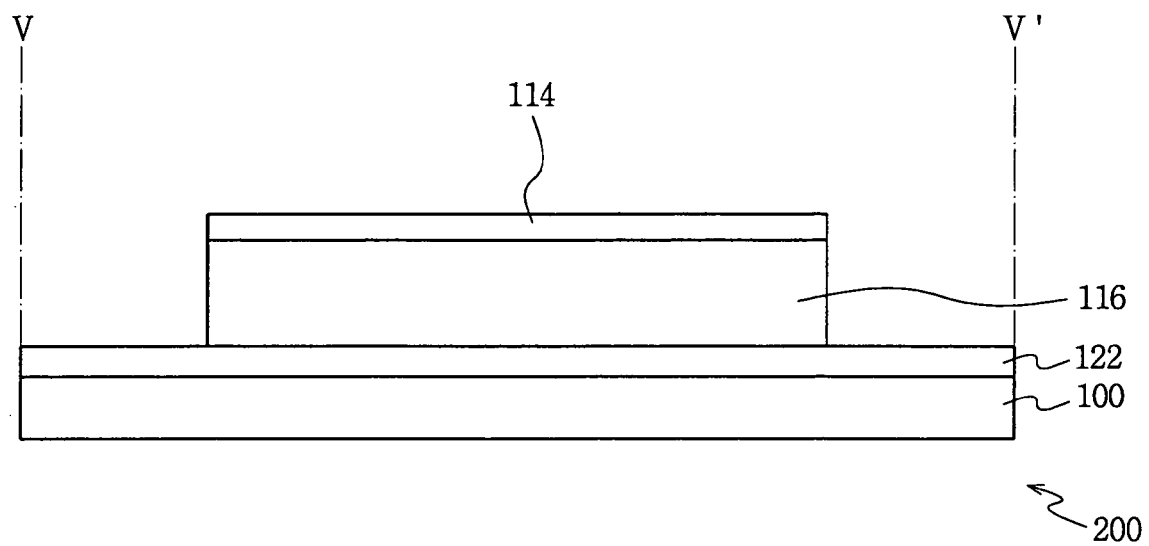
Figure 7B:
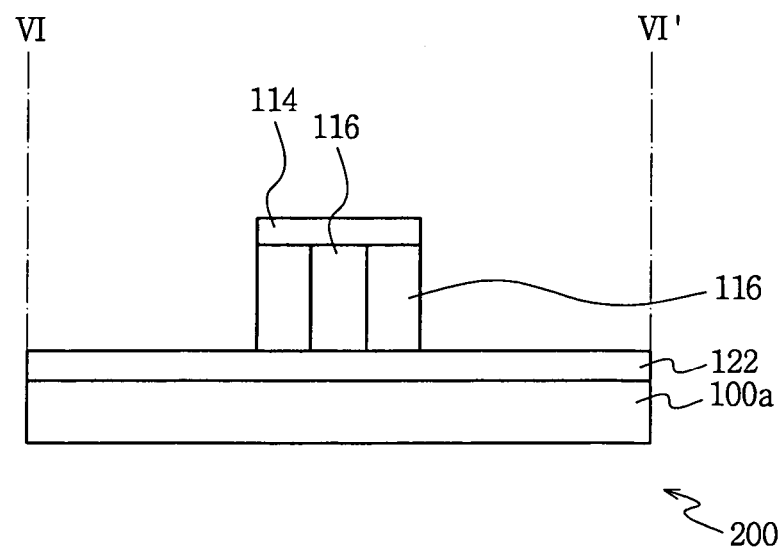

As shown in FIG. 7b, the single-crystal silicon layer or film of the SOI type silicon substrate 200 is etched by using the hard mask layer (114 of FIG. 7a) as an etch mask, to form, under the hard mask layer 114, a fin active region 116 having a predetermined height from an upper surface of the substrate insulation layer 122. Then the hard mask layer 114 is partially removed. This etching of the single-crystal silicon layer 100b may employ a dry etching method by using a reactive gas having a prominent etching characteristic for the single-crystal silicon layer 100b. This fin active region 116 is formed to have a height of about 500 Å to under about 5000 Å from an upper surface of the substrate insulation layer 122.

Then, a line width of the hard mask layer 114 formed on an upper central portion of the fin active region 116 is reduced by a general photolithography and etching method, and a center portion of the fin active region 116 is trimmed and reduced by using the hard mask layer 114 as an etch mask. Then the hard mask layer 114 is removed.

Figure 7C:
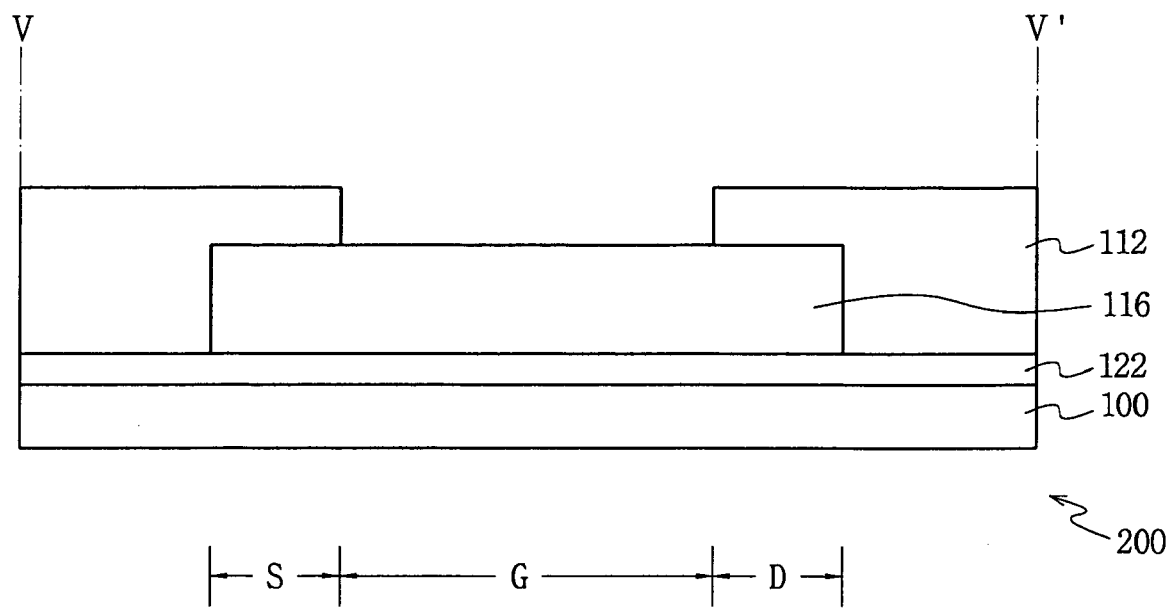
Figure 7C:
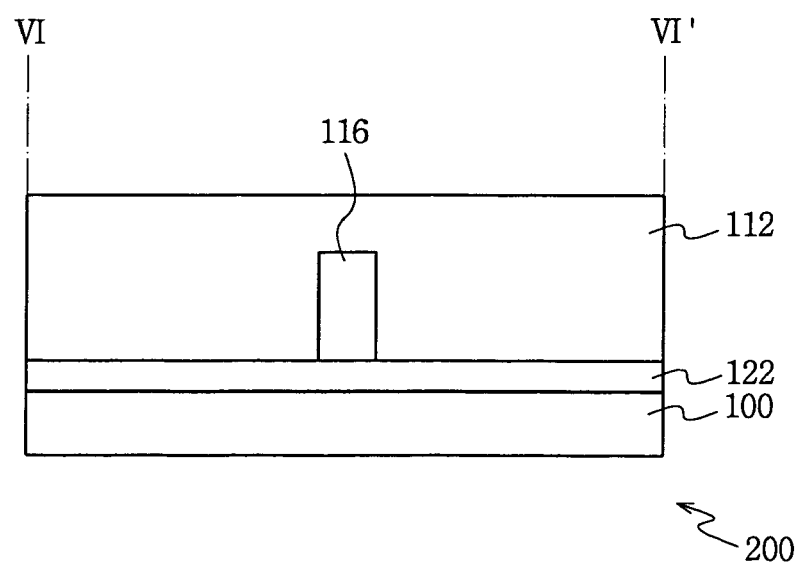

In FIG. 7c, an interlayer dielectric layer (ILD) 112 having a predetermined thickness is formed of a silicon oxide layer by CVD, on the substrate interlayer layer 122 on which the fin active region 116 was formed. The interlayer dielectric layer 112 is planarized by CMP, and the fin active region 116 of a gate region G is exposed by a general photolithography and etching method, and the interlayer dielectric layer 112 is removed by a dry etching method without exposing a silicon substrate of the SOI type silicon substrate 200. In removing the interlayer dielectric layer 112, a time etch method may be used to remove the interlayer dielectric layer 112 having a predetermined thickness. For instance, the interlayer dielectric layer 112 is formed to have a thickness of about 3000 Å to about 5000 Å. The photolithography and etching method for exposing the fin active region 116 of the gate region G includes processes of entirely depositing the semiconductor substrate 100 on which the interlayer dielectric layer 112 was formed, with photoresist; patterning the photoresist so that the photoresist is selectively left on both ends of the fin active region 116 corresponding to source region S and a drain region D; and removing the interlayer dielectric layer 112 of a predetermined thickness to expose the fin active region 116 of the gate region G and not to expose the silicon substrate 100 by a dry etching method by using the photoresist as an etch mask or screen. The interlayer dielectric layer 112 left on the fin active region 116 of the source region S and the drain region D is later used to form the gate electrode (110 of FIG. 6) by a damascene method. Although not shown in the drawing, if a center portion of the fin active region 116 is not trimmed and the hard mask layer (114 of FIG. 3b) is not removed, then a center portion of the fin active region 116 exposed by the interlayer dielectric layer 112 may be trimmed, thus further reducing a line width of the center portion of the fin active region 116 compared to a line width of both ends of the fin active region 116. Then, the hard mask layer 114 exposed by the interlayer dielectric layer 112 may be removed.

Figure 7D:
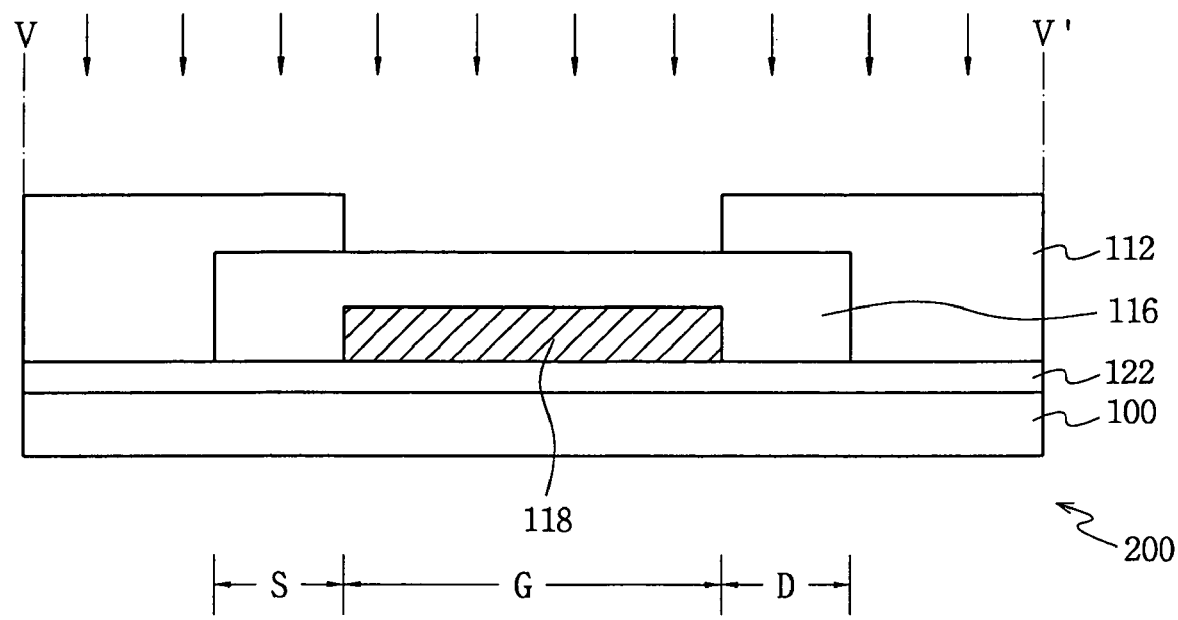
Figure 7D:
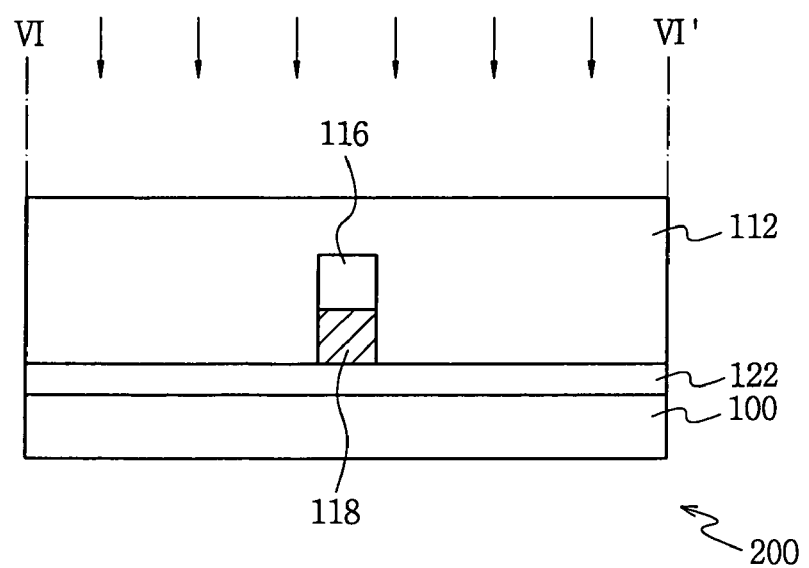

In FIG. 7d, an impurity is selectively ion-implanted in the fin active region 116 of the gate region G by using the interlayer dielectric layer 112 as an ion implantation mask or screen, to thus form a buried impurity region 118. The interlayer dielectric layer 112 is formed on an upper part and in a side wall of the fin active region 116 corresponding to the source region S and the drain region D. This buried impurity may be any one of non-metallic conductive impurities such as boron, $BF_2$, or phosphorous, and of a low mass element such as H and He having a low atomic mass. The impurity is ion-implanted with a predetermined projection range into the fin active region 116 formed of a single-crystal silicon layer or film, and penetrates the silicon lattice to a predetermined depth. For example, if the boron is ion implanted at a density of about $1\times10^{16}$ atoms/cm² to about $1\times10^{18}$ atoms/cm² with an energy of about 30 KeV to about 40 KeV, the ion-implantation is performed to form the buried impurity region 118 at a depth of about 1000 Å to about 1200 Å from an upper surface of the fin active region 116. Thus, the projection range can be controlled, thereby forming the buried impurity region 118 that is formed with a predetermined depth from an upper surface of the fin active region 116 to a depth the same or similar to a surface of the semiconductor substrate bulk 100a.

Figure 7E:
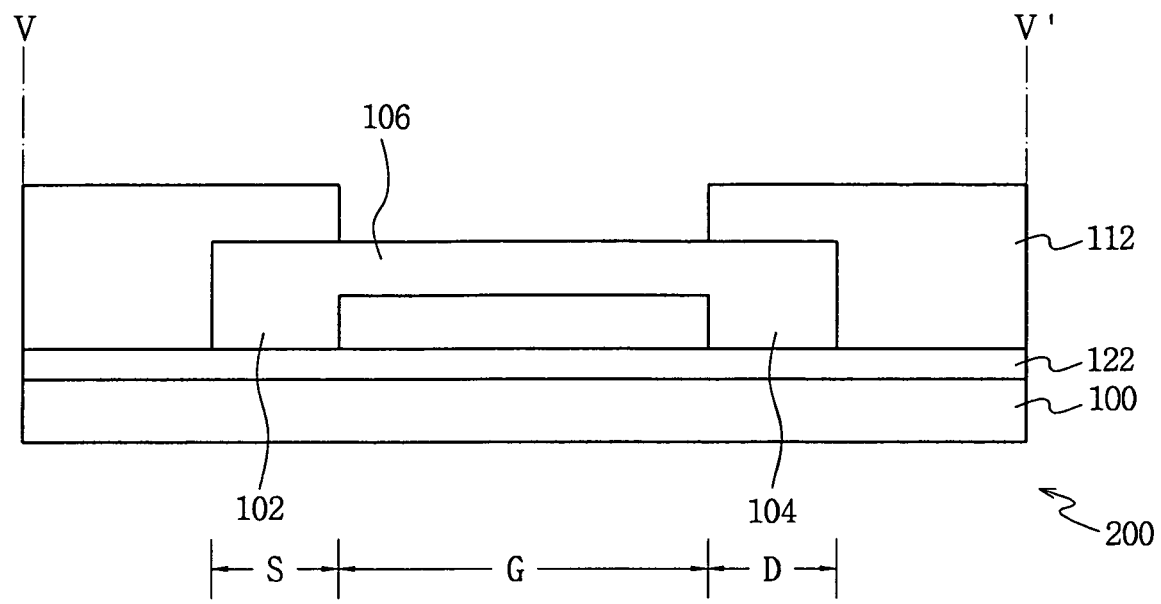
Figure 7E:
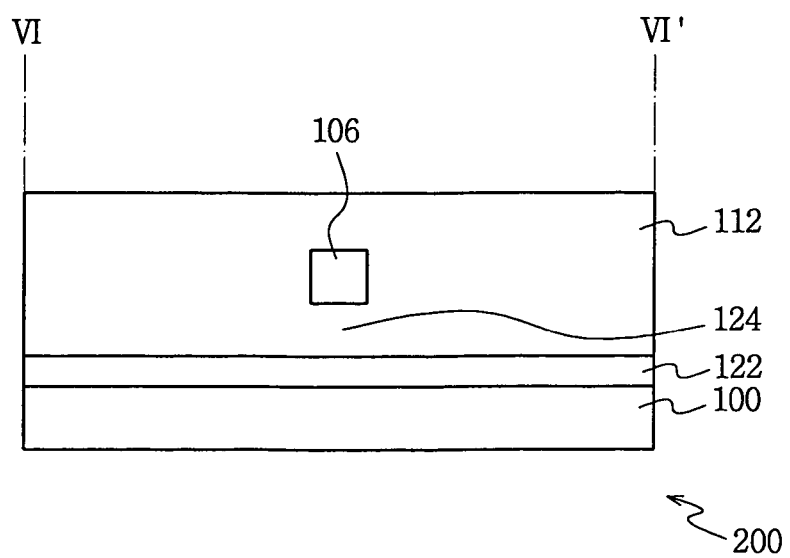

As shown in FIG. 7e, the buried impurity region (118 of FIG. 7d) is selectively isotropic-etched to form a third active region 106 with a bridge shape that is distanced vertically from the substrate insulation layer 122 and that is supported by the first and second active regions 102 and 104 provided as the fin active region 116 of the source region S and the drain region D. The isotropic etching of the buried impurity region 118 may be performed by a wet etching or a dry etching method. In the wet etching method an etchant solution may be a polysilicon etchant of HF (49%): $HNO_3$ (30%): $CH_3COOH$ (100%)(Volume 1:3:8), and the polysilicon etchant may be used as selectively removing the buried impurity region 118 in which the silicon lattice combination is cut. A reactive gas used in the dry etching method may be $CF_4:O_2$ (flow 60:150 sccm), and this reactive gas may be used as selectively removing the buried impurity region as compared with the first to third active regions 102, 104 and 106 formed of single-crystal silicon layer or film. Also, though the third active region 106 is provided as a bridge shape having right-angular corners for four faces in FIG. 7e, it may be formed in a bridge type having a round shape without corners or having polygon corners in case the dry etching or wet etching method is used. At this time, the buried impurity region 118 under the third active region 106 is removed, to thus form a tunnel 124 distanced between the third active region 106 and the semiconductor substrate bulk 100a.

The manufacturing method of this exemplary embodiment, therefore, can substantially reduce a generation rate of crystalline defect and increase reliability of devices, by forming the third active region 106 with single-crystal silicon layer or film of the SOI type substrate 200, as compared with the single-crystal silicon layer formed through an epitaxial growth method.

Next, a first conductive impurity is selectively ion-implanted in the third active region 106 by using the interlayer dielectric layer 112 as an ion implantation mask or screen, to thus form a third impurity region as a channel impurity region. At a width or thickness of the third active region 106 of over about 500 Å, the first conductive impurity is ion implanted to control a threshold voltage value, and at a width or thickness of the third active region 106 of under about 500 Å, the threshold voltage value is pinned uniformly depending upon only a work function of single-crystal silicon, thus the first conductive impurity is not ion implanted. If the first conductive impurity is an accepter impurity, boron, or $BF_2$ may be used, and in case it is a donor impurity, As or phosphorus may be used.

Figure 7F:
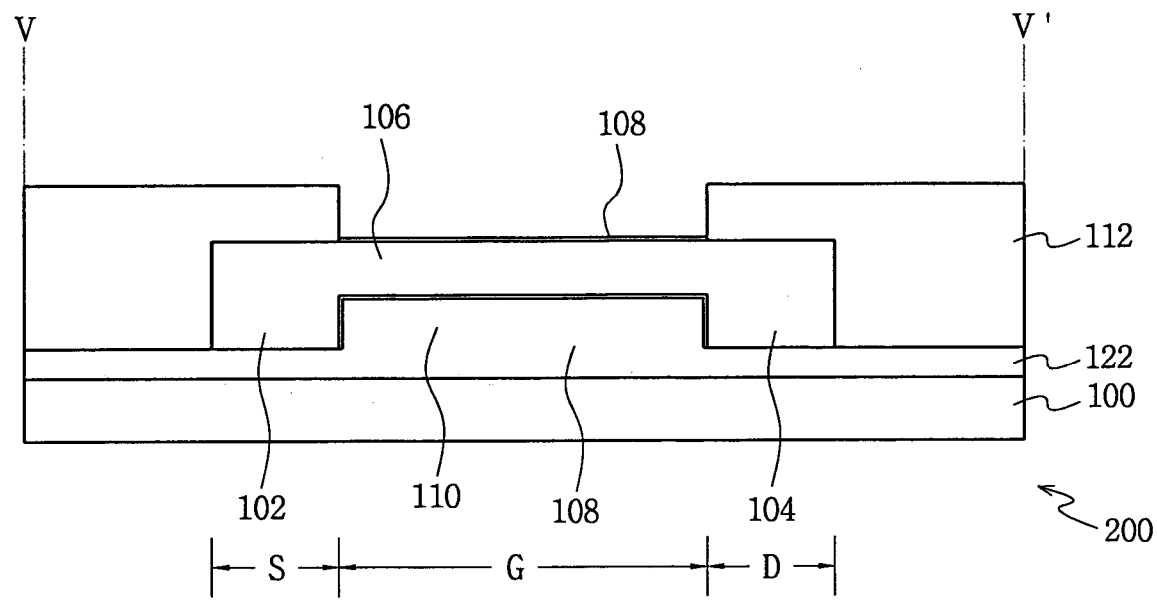
Figure 7F:
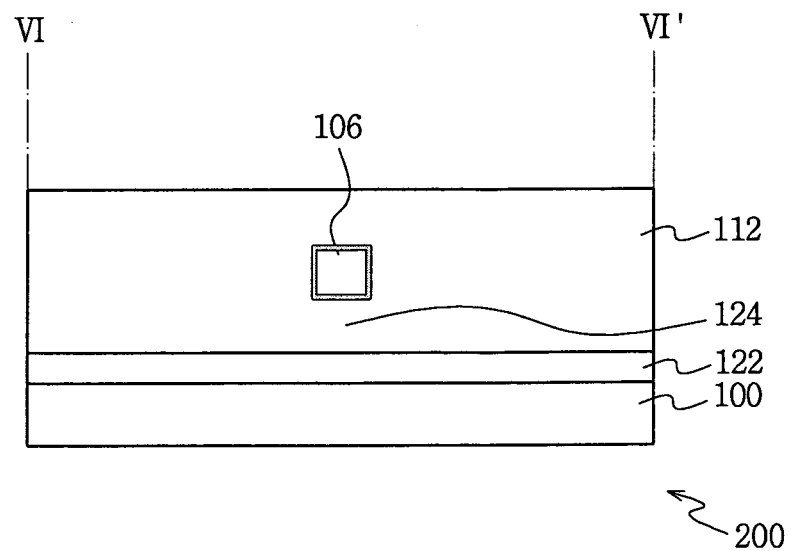

As shown in FIG. 7f, a gate insulation layer 108 having a predetermined thickness is formed of a silicon oxide layer, entirely on the third active region 106 exposed by the interlayer dielectric layer 112. The gate insulation layer 108 is formed with the same or similar thickness, not only on the third active region 106, but also on sidewalls of the first and second active regions 102 and 104 adjacent to the third active region 106. For example, the gate insulation layer 108 may be formed of a silicon oxide layer with a thickness of under about 130 Å, by a thermal oxidation process, on the third active region 106 and on a surface of the semiconductor substrate bulk 100a provided under the third active region 106. If the interlayer dielectric layer 112 is first formed and a center portion of the fin active region (116 of FIG. 3d) is then trimmed, the gate insulation layer 108 may be formed on sidewalls of the first and second active regions 102 and 104 adjacent to the third active region 106.

Figure 7G:
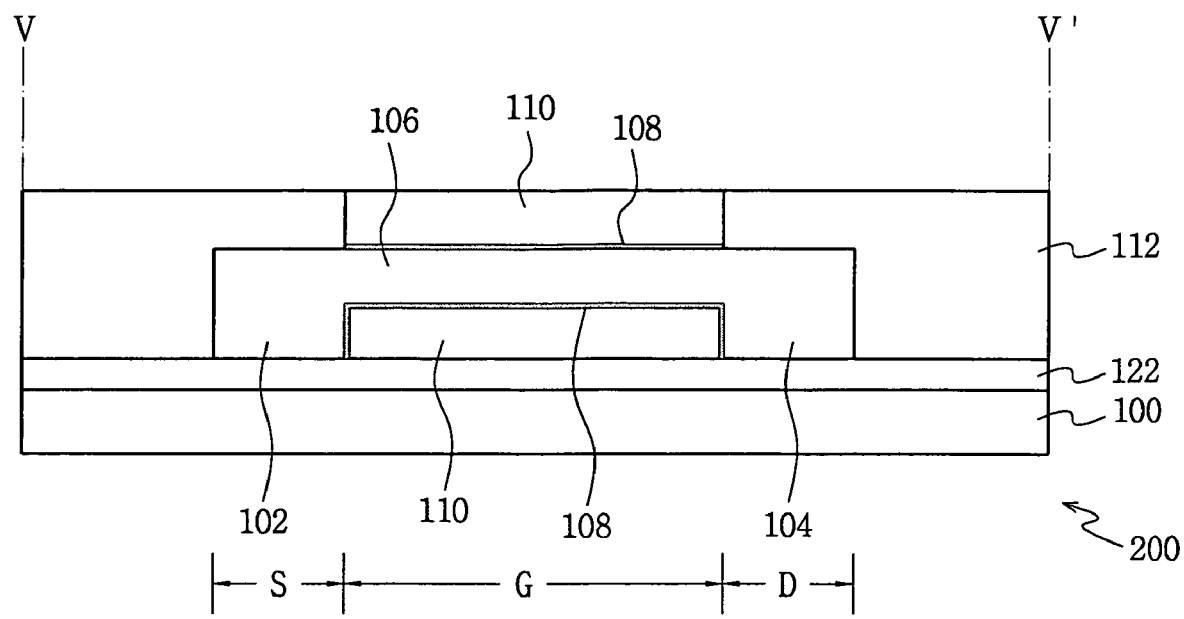
Figure 7G:
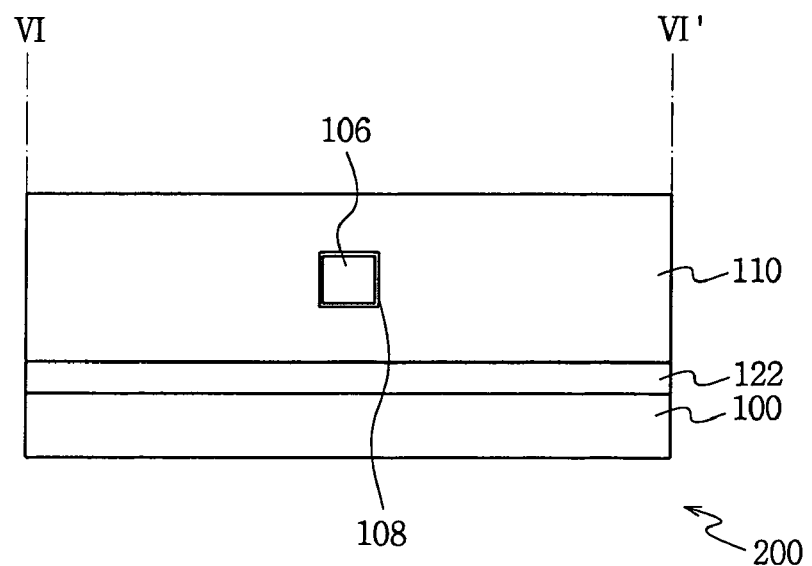

As shown in FIG. 7g, conductive material having a predetermined thickness is formed to entirely surround the third active region 106 on which the gate insulation layer 108 was formed. This conductive material is formed covering an entire face of the third active region 106, the substrate insulation layer 122 and the interlayer dielectric layer 112. Then, the conductive material is planarized and removed to expose the interlayer dielectric layer 112 by a CMP or dry etching method, and subsequently the gate electrode 110 is formed by a damascene method. This conductive material may be a polysilicon layer containing a non-metal conductive impurity and a metal layer such as tungsten silicide, and may be formed by an LPCVD (Low Pressure Chemical Vapor Deposition). In forming the conductive material, the substrate insulation layer 122 and the interlayer dielectric layer 112, and the first and second active regions 102 and 104 exposed by the interlayer dielectric layer 112, serve as a mold capable of selectively forming the conductive material entirely on the third active region 106 connected with the first and second active regions 102 and 104. The gate electrode 110 formed by the damascene method may be obtained in such a way that the polysilicon containing a non-metal conductive impurity or the metal layer is formed by CVD to surround by 360° the third active region 106 selectively exposed by the interlayer dielectric layer 112 from the substrate insulation layer 122 and the first and second active regions 102 and 104, and that the polysilicon layer or the metal layer is planarized and removed to expose the interlayer dielectric layer 112 by CMP or dry etching. Thus, the gate electrode 110 is formed in a line shape crossed with the fin active region 116 by the interlayer dielectric layer 112. At this time, if the polysilicon layer is used as the gate electrode 110, conductive impurity may be doped in the midst of forming the polysilicon layer by CVD, or the non-metal conductive impurity may be ion-implanted and doped after first forming the polysilicon layer.

Accordingly, in the manufacturing method of the FET according to the exemplary embodiment, when patterning the gate electrode 110 filled in the tunnel 124 formed under the third active region 106 of the bridge structure, the damascene method is used instead of the conventional photolithography and etching method to reproducibly form the gate electrode 110, thus a width of the gate electrode 110 can be easily controlled by using the interlayer dielectric layer 112 formed on the upper part and in the sidewall of the first and second active regions 102 and 104, thereby precisely controlling a length of channel induced by the third active region 106 by a gate voltage applied to the gate electrode 110.

In addition, the gate electrode 110, entirely surrounding the third active region 106 connected with the first and second active regions 102 and 104, is electrically isolated from the silicon substrate 100 provided under the third active region 106 by using the substrate insulation layer 122.

Figure 7H:
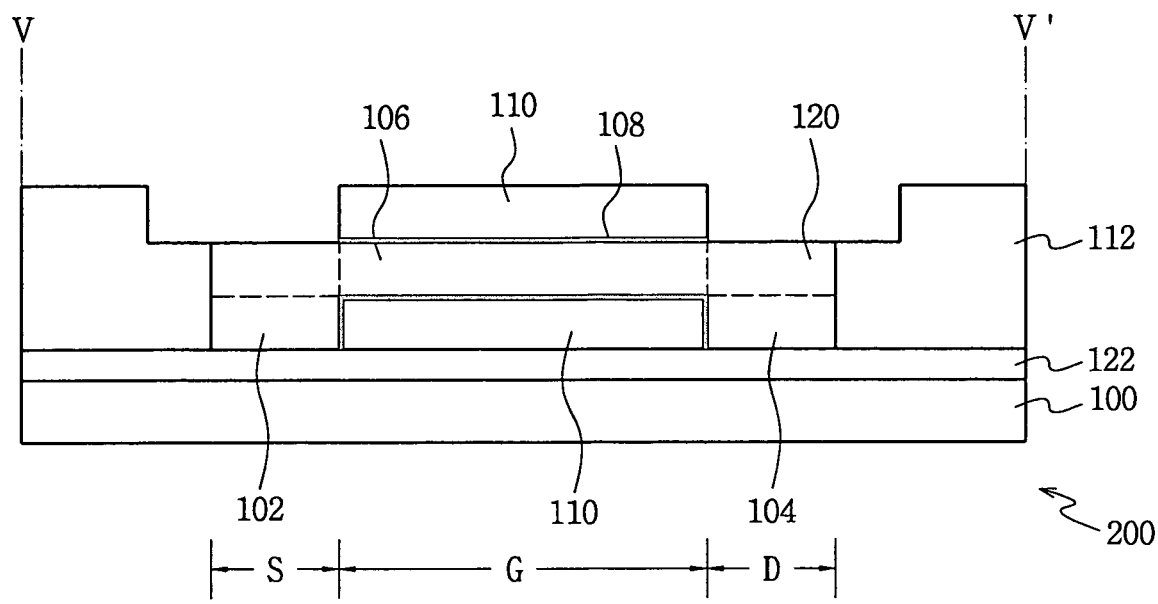
Figure 7H:
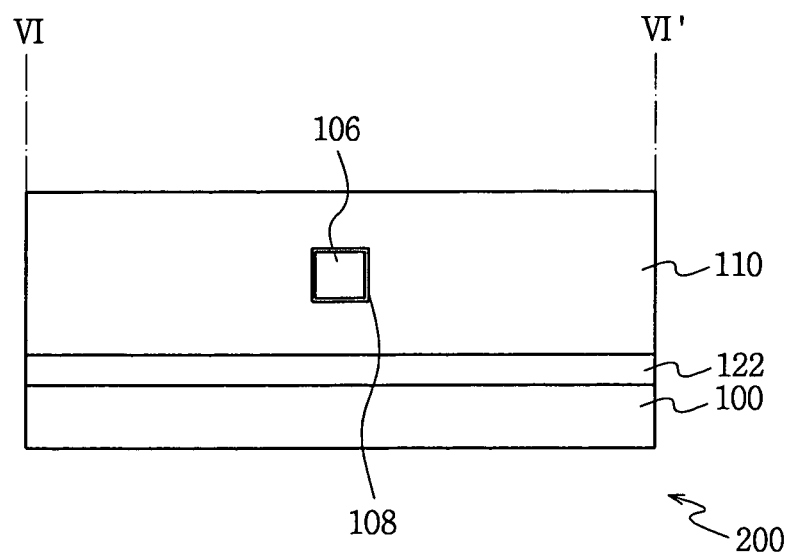

Referring to FIG. 7h, the interlayer dielectric layer 112 formed on the first and second active regions 102 and 104 is removed by a general photolithography and etching method, to expose the first and second active regions 102 and 104, and then a second conductive impurity different than the first conductive impurity is ion implanted in the first and second active regions 102 and 104, to form a first impurity region 120. For example, the second conductive impurity is ion implanted with a density of about $1\times10^{12}$ atoms/cm$^2$ to about $1\times10^{14}$ atoms/cm$^2$, and with energy of under 50 KeV to form the first impurity region 120 on the first and second active regions 102 and 104. Thus, in the exemplary embodiment, the gate electrode 110 surrounding the third active region 106 is isolated from the silicon substrate 100 by the substrate insulation layer 122, thereby enhancing an electrical characteristic of the device. Further, the first impurity region 120 formed on the first and second active regions 106 is formed of a single-crystal silicon layer doped with a conductive impurity, thus further increasing an electrical conduction as compared with a polysilicon layer doped with a conductive impurity.

Subsequently, a spacer is formed on sidewalls of the gate electrode 110 adjacent to the first and second active regions 102 and 104 in which the first impurity region 120 was formed, and the second conductive impurity is ion implanted in the first and second active regions with a density of about $1\times10^{16}$ atoms/cm$^2$ to about $1\times10^{17}$ atoms/cm$^2$, by using the gate electrode 110 and the spacer as an ion implantation mask or screen, to form a second impurity region having a depth shallower than the first impurity region 120. Then, a specific interlayer dielectric layer is entirely formed on the first and second active regions on which the second impurity region was formed and on the semiconductor substrate, and the interlayer dielectric layer provided on the second impurity region is removed to form a contact hole.

As described above, in this exemplary embodiment, the gate electrode 110 is insulated from a surface of the silicon substrate 100 by using the SOI type silicon substrate 200, thereby preventing a channel from being formed along a surface of the silicon substrate 100, even if a gate voltage is applied to the gate electrode 110. An electrical characteristic can be more enhanced than in the previous two exemplary embodiments.

According to the exemplary embodiments of the invention, in the FET and a manufacturing method thereof a silicon substrate 100 of single-crystal silicon material is provided as a channel formation region, and a gate electrode 110 surrounding the channel formation region is formed by a damascene method. A source region S and a drain region D of both sides of the gate electrode 110 are formed as the silicon substrate 100, whereby further improving the reliability of the device and an electrical characteristic, as compared with a conventional FET.

As described above, the inventive FET and the manufacturing method thereof have the following advantages.

First, a third active region of a bridge shape connected with first and second active regions can be formed on a single-crystal silicon substrate as a channel having a prominent electrical characteristic as compared with a single-crystal silicon layer formed by an epitaxial growth method, thereby increasing reliability of devices.

Second, an interlayer dielectric layer formed on the first and second active regions is used as a mold having a predetermined shape so that a gate electrode can be reproducibly formed by a damascene method, thereby precisely controlling a length of an overall channel of a gate.

Third, a source region and a drain region are formed of a single-crystal silicon substrate having a prominent electrical conduction, thus enhancing an electrical characteristic.

While the present invention has been particularly shown and described with reference to exemplary embodiments thereof, it will be understood by those of ordinary skill in the art that various changes in form and details may be made therein without departing from the spirit and scope of the present invention as specified by the following claims.

What is claimed is:

1. A method of manufacturing a field effect transistor (FET), the method comprising:
    providing a semiconductor substrate including a lower layer and an upper layer overlying the lower layer, the upper layer a single-crystal silicon layer;
    forming first and second active regions from the upper layer, first and second active regions spaced apart from each other and protruding from an upper surface of the lower layer;
    forming a third active region of a bridge shape from the upper layer, which is distanced vertically from the upper surface of the lower layer and which connects the first and second active regions; and
    forming a gate, insulation layer surrounding the third active region, and forming a gate electrode on the gate insulation layer so that the third active region functions as a channel.

2. The method of claim 1, wherein the forming of the first, second and third active regions comprises:
    forming a fin active region protruded from the lower layer;
    forming an interlayer dielectric layer on the first and second active regions of both ends of the fin active region;
    ion implanting an impurity in a center portion of the fin active region to form a buried impurity region by using the interlayer dielectric layer as an ion implantation mask; and
    selectively removing the buried impurity region to form a channel impurity region, which is connected by a bridge shape with the first and second active regions.

3. The method of claim 2, wherein the forming of the fin active region comprises:
    forming a hard mask layer on the semiconductor substrate; and
    forming the fin active region by removing the upper layer to expose the lower layer by using the hard mask layer as an etch mask.

4. The method of claim 3, wherein the hard mask layer is formed of a silicon nitride layer.

5. The method of claim 3, further comprising trimming a center portion of the fin active region exposed by the interlayer dielectric layer so that a line width of the fin active region between the first and second active regions is smaller than a line width of the first and second active regions.

6. The method of claim 3, further comprising removing the hard mask layer.

7. The method of claim 2, wherein the forming of the interlayer dielectric layer comprises:
    forming the interlayer dielectric layer on the semiconductor substrate on which the fin active region was formed; and
    selectively removing the interlayer dielectric layer to expose the fin active region on which the gate electrode will be formed.

8. The method of claim 2, wherein the interlayer dielectric layer is formed of silicon oxide.

9. The method of claim 8, wherein the silicon oxide layer is formed by a low pressure chemical vapor deposition (LPCVD).

10. The method of claim 7, further comprising planarizing the interlayer dielectric layer formed on the semiconductor substrate by chemical mechanical polishing (CMP).

11. The method of claim 2, wherein the impurity is any one of boron, $BF_2$, phosphorus, H, and He.

12. The method of claim 2, wherein the buried impurity region is formed by an ion implantation at energy of about 30 KeV to about 40 KeV if boron is used as the impurity.

13. The method of claim 2, wherein the buried impurity region is formed from a predetermined surface depth of the fin active region to a depth the same as or similar to the lower layer of the semiconductor substrate.

14. The method of claim 2, wherein the buried impurity region is formed by an ion implantation at a density of about $1 \times 10^{16}$ atoms/cm$^2$ to about $1 \times 10^{18}$ atoms/cm$^2$.

15. The method of claim 2, wherein the buried impurity region is removed by wet or dry etching.

16. The method of claim 15, wherein the buried impurity region is removed by using a polysilicon etchant of HF(49%): $HNO_3$(30%):$CH_3COOH$(100%) (Volume 1:3:8) by the wet etching.

17. The method of claim 15, wherein the buried impurity region is removed by using a reactive gas of $CF_4$:$O_2$ (flow 60:150 sccm) by the dry etching.

18. The method of claim 1, wherein the gate insulation layer is formed of silicon oxide.

19. The method of claim 1, wherein the gate insulation layer is formed to a thickness of less than about 130 Å.

20. The method of claim 1, wherein the gate electrode is formed by a damascene method in which the lower layer of the semiconductor substrate and the interlayer dielectric layer are used as a mold having a predetermined shape.

21. The method of claim 1, wherein the gate electrode is formed containing any one of a polysilicon layer doped with a non-metallic conductive impurity or tungsten silicide.

22. The method of claim 1, further comprising forming a source/drain impurity region by ion implanting impurity in the first and second active regions by using the gate electrode as an ion implantation mask.

23. The method of claim 22, wherein the source/drain impurity region is formed on the first and second active regions that have a depth the same as or similar to the third active region.

24. A method of manufacturing a semiconductor device, the method comprising:
   forming fin active regions, which are distanced from each other and which are protruded from an upper surface of a lower layer supporting an upper layer of a semiconductor substrate;
   forming an interlayer dielectric layer on first and second active regions of both ends of the fin active region to expose a center portion of the fin active region;
   ion implanting an impurity to form a buried impurity region with a depth equal to or similar to a height of the fin active region, in the center portion of the fin active region, using the interlayer dielectric layer as an ion implantation mask;
   forming a third active region of a bridge shape, which is connected with the first and second active regions and which is distanced vertically from the lower layer, by selectively removing the buried impurity region;
   forming a gate insulation layer surrounding the third active region;
   forming a gate electrode on the gate insulation layer so that the third active region functions as a channel;
   removing the interlayer dielectric layer from the first and second active regions; and
   ion implanting a conductive impurity in the first and second active regions to form a source/drain impurity region by using the gate electrode as an ion implantation mask.

25. A method of manufacturing an FET, the method comprising:
   forming first and second active regions distanced from each other on an insulation layer;
   forming a third active region of a bridge shape, which is distanced vertically from an upper surface of the insulation layer and which connects the first and second active regions, the first, second, and third active regions formed from a single-crystal silicon layer;
   forming a gate insulation layer to surround the third active region; and
   forming a gate electrode on the gate insulation layer so that the third active region functions as a channel.

26. The method of claim 25, wherein the insulation layer employs a substrate insulation layer of an SOI (Silicon On Insulator) type silicon substrate.

27. A method of manufacturing an FET, the method comprising:
   forming a fin active region on a substrate insulation layer of an SOI type silicon substrate;
   forming an interlayer dielectric layer on first and second active regions of both ends of the fin active region, to expose a center portion of the fin active region;
   forming a buried impurity region with a depth equal or similar to a height of the fin active region, in a center portion of the fin active region, by ion implanting an impurity by using the interlayer dielectric layer as an ion implantation mask;
   forming a channel impurity region of a bridge shape, which is connected with the first and second active regions and is distanced vertically from the substrate insulation layer, by selectively removing the buried impurity region;
   forming a gate insulation layer surrounding the third active region;
   forming a gate electrode on the gate insulation layer so that the third active region functions as a channel;
   removing the interlayer dielectric layer from the first and second active regions; and
   ion implanting a conductive impurity in the first and second active regions to form a source/drain impurity region by using the gate electrode as an ion implantation mask.

28. The method of claim 1, the third active region distanced vertically from the upper surface of the lower layer such that a lower surface of the third active region is distanced vertically from the upper surface of the lower layer.

29. The method of claim 25, the third active region distanced vertically from the upper surface of the insulation layer such that a lower surface of the third active region is distanced vertically from the upper surface of the insulation layer.

* * * * *

UNITED STATES PATENT AND TRADEMARK OFFICE
CERTIFICATE OF CORRECTION

PATENT NO. : 7,407,845 B2 Page 1 of 1
APPLICATION NO. : 11/048369
DATED : August 5, 2008
INVENTOR(S) : Choong-Ho Lee et al.

It is certified that error appears in the above-identified patent and that said Letters Patent is hereby corrected as shown below:

Column 7, line 51, the word "enchant" should read -- etchant --;
Column 22, line 25, the words "gate, insulation" should read -- gate insulation --.

Signed and Sealed this

Fourth Day of November, 2008

JON W. DUDAS
*Director of the United States Patent and Trademark Office*